(12) United States Patent
Kawamura et al.

(10) Patent No.: US 10,396,568 B2
(45) Date of Patent: Aug. 27, 2019

(54) BATTERY CHARGER WITH USER INTERFACE

(71) Applicant: TRAXXAS LP, McKinney, TX (US)

(72) Inventors: Tom Kawamura, Plano, TX (US); Kent Poteet, Lucas, TX (US)

(73) Assignee: TRAXXAS LP, McKinney, TX (US)

( * ) Notice: Subject to any disclaimer, the term of this patent is extended or adjusted under 35 U.S.C. 154(b) by 111 days.

(21) Appl. No.: 14/504,398

(22) Filed: Oct. 1, 2014

(65) Prior Publication Data

US 2016/0099580 A1    Apr. 7, 2016

(51) Int. Cl.
*H02J 7/00* (2006.01)
*G01R 31/382* (2019.01)

(52) U.S. Cl.
CPC .......... *H02J 7/0003* (2013.01); *G01R 31/382* (2019.01); *H02J 7/0004* (2013.01); *H02J 7/007* (2013.01); *H02J 7/0047* (2013.01); *H02J 7/0052* (2013.01); *H02J 2007/0098* (2013.01)

(58) Field of Classification Search
USPC ................................................ 320/106, 109
See application file for complete search history.

(56) References Cited

U.S. PATENT DOCUMENTS

| | | |
|---|---|---|
| D179,946 S | 3/1957 | Kerr |
| 3,794,957 A | 2/1974 | Winkler |
| 4,193,655 A | 3/1980 | Herrmann, Jr. |
| 5,049,804 A | 9/1991 | Hutchings |
| 5,111,128 A | 5/1992 | Branan, Jr. et al. |
| 5,130,634 A | 7/1992 | Kasai |
| 5,283,512 A | 2/1994 | Stadnick et al. |
| 5,370,556 A | 12/1994 | Olsson |
| 5,371,453 A | 12/1994 | Fernandez |
| 5,575,674 A | 11/1996 | Davis et al. |
| 5,744,937 A | 4/1998 | Cheon |
| 5,816,842 A | 10/1998 | Thantrakul et al. |
| 5,822,427 A | 10/1998 | Braitberg et al. |
| 5,844,400 A | 12/1998 | Ramsier et al. |

(Continued)

FOREIGN PATENT DOCUMENTS

| | | |
|---|---|---|
| CN | 201 210 314 Y | 3/2009 |
| DE | 202004012366 | 10/2004 |

(Continued)

OTHER PUBLICATIONS

PCT/US15/53466; International Search Report and Written Opinion; dated Dec. 3, 2015.

(Continued)

*Primary Examiner* — Samuel Berhanu
(74) *Attorney, Agent, or Firm* — Daryl R. Wright; Greg Carr

(57) ABSTRACT

A battery single charger may accommodate Li-type and Ni-type batteries, having default charge settings and user-adjustable charge parameters in an 'advanced mode'. Lithium Polymer (LiPo) batteries equipped with RFID technology and integrated balance taps may communicate with a device such as a battery charger equipped with similar technology providing information such as chemistry type, cell count, recommended charge rates, number of charges on the battery, among other types of information. Several safety features may be included.

21 Claims, 14 Drawing Sheets

(56) References Cited

U.S. PATENT DOCUMENTS

| | | |
|---|---|---|
| 5,865,651 A | 2/1999 | Dague et al. |
| 5,867,006 A | 2/1999 | Dias et al. |
| 5,949,216 A | 9/1999 | Miller |
| 6,007,362 A | 12/1999 | Davis et al. |
| 6,014,008 A | 1/2000 | Hartzell et al. |
| 6,022,246 A | 2/2000 | Ko |
| 6,152,597 A | 11/2000 | Potega |
| 6,184,655 B1 | 2/2001 | Malackowski |
| 6,232,750 B1* | 5/2001 | Podrazhansky ....... H02J 7/0093 320/139 |
| 6,236,186 B1 | 5/2001 | Helton et al. |
| 6,634,896 B1 | 10/2003 | Potega |
| 6,746,284 B1 | 6/2004 | Spink, Jr. |
| D494,933 S | 8/2004 | Lu |
| 7,059,769 B1 | 6/2006 | Potega |
| 7,104,831 B2 | 9/2006 | Fukatsu et al. |
| D552,560 S | 10/2007 | Victor |
| 7,374,460 B1 | 5/2008 | Hariharesan et al. |
| D573,536 S | 7/2008 | Hariharesan et al. |
| D576,557 S | 9/2008 | Hariharesan et al. |
| D577,671 S | 9/2008 | Schnitzler |
| D589,881 S | 4/2009 | Kok et al. |
| 7,615,963 B2 | 11/2009 | Tashiro et al. |
| 7,696,718 B2 | 4/2010 | Suzuki |
| 7,736,197 B2 | 6/2010 | Takeda |
| 7,888,913 B1 | 2/2011 | Marty et al. |
| 8,029,310 B2 | 10/2011 | Shindo et al. |
| 8,123,571 B2 | 2/2012 | Brown et al. |
| D659,640 S | 5/2012 | Tseng |
| D662,889 S | 7/2012 | Smith |
| D665,748 S | 8/2012 | Baker et al. |
| 8,974,244 B2 | 3/2015 | Aihara |
| 8,998,656 B2 | 4/2015 | Amano et al. |
| D743,338 S | 11/2015 | Christensen et al. |
| D743,339 S | 11/2015 | Christensen et al. |
| 10,027,146 B2 | 7/2018 | Christensen et al. |
| 10,075,001 B2 | 9/2018 | Christensen et al. |
| 2002/0070702 A1 | 6/2002 | Ragnarsson |
| 2002/0072275 A1 | 6/2002 | Arai |
| 2003/0160592 A1 | 8/2003 | Murakami et al. |
| 2004/0066174 A1 | 4/2004 | Choi |
| 2005/0174094 A1* | 8/2005 | Purdy ................... H02J 7/0052 320/134 |
| 2006/0145661 A1 | 7/2006 | Patino et al. |
| 2006/0194102 A1 | 8/2006 | Keshishian et al. |
| 2007/0069688 A1 | 3/2007 | Satsuma |
| 2007/0080660 A1 | 4/2007 | Fagan et al. |
| 2007/0182367 A1* | 8/2007 | Partovi ................... H01F 5/003 320/108 |
| 2008/0007218 A1 | 1/2008 | Veselic |
| 2008/0048614 A1 | 2/2008 | Partin et al. |
| 2008/0261460 A1 | 10/2008 | Hariharesan et al. |
| 2008/0297104 A1 | 12/2008 | Rao et al. |
| 2009/0096421 A1 | 4/2009 | Seman, Jr. |
| 2009/0289599 A1 | 11/2009 | White et al. |
| 2010/0171460 A1 | 7/2010 | Nakajima et al. |
| 2010/0295503 A1 | 11/2010 | Bourilkov et al. |
| 2011/0003512 A1 | 1/2011 | Bower et al. |
| 2011/0248680 A1 | 10/2011 | Timmons et al. |
| 2011/0294361 A1 | 12/2011 | Schrader |
| 2012/0109402 A1 | 5/2012 | Shelton et al. |
| 2012/0249083 A1* | 10/2012 | Garrastacho ............ H02J 7/027 320/155 |
| 2012/0319658 A1 | 12/2012 | White et al. |
| 2013/0057198 A1 | 3/2013 | Gerlovin |
| 2013/0260182 A1 | 10/2013 | Knitt et al. |
| 2014/0239881 A1* | 8/2014 | Cassidy ................ H02J 7/0042 320/107 |
| 2014/0245036 A1 | 8/2014 | Oishi |
| 2014/0335739 A1 | 11/2014 | Sato et al. |
| 2015/0048780 A1* | 2/2015 | Listl ................... H01M 10/441 320/106 |
| 2015/0126075 A1 | 5/2015 | Chen et al. |
| 2015/0180175 A1 | 6/2015 | Yu et al. |
| 2015/0249360 A1 | 9/2015 | Ichikawa |
| 2015/0255890 A1 | 9/2015 | Xu et al. |
| 2016/0087314 A1 | 3/2016 | Arashima et al. |

FOREIGN PATENT DOCUMENTS

| | | |
|---|---|---|
| DE | 20 2012 000 291 U1 | 4/2012 |
| DE | 20 2012 103996 U1 | 1/2013 |
| DE | 202013004312 | 8/2013 |
| EP | 0 780 915 A1 | 6/1997 |
| EP | 1 128 517 A3 | 12/2003 |
| EP | 2 416 407 A1 | 2/2012 |
| JP | 2005-237155 A | 9/2005 |
| JP | 2011 243426 A | 12/2011 |
| JP | 2013-051780 A | 3/2013 |
| WO | 99/38238 A1 | 7/1999 |
| WO | 2007/015605 A1 | 2/2007 |
| WO | WO 2010/028368 A1 | 3/2010 |
| WO | WO 2013/104431 A1 | 7/2013 |

OTHER PUBLICATIONS

PCT/US15/53478; International Search Report and Written Opinion; dated Nov. 23, 2015.
Unknown; PCT/US2015/034083; International Search Report & Written Opinion; dated Sep. 10, 2015.
Molex; Imperium HVHC Connector System data sheet_www.molex.com_171466-9001; May 13, 2014.
Molex; Imperium HVHC Connector System engr dwg_MDATA_DS-171466-9000; May 13, 2014.
Molex; Imperium HVHC Connector System application specification_J. Quiles_AS-171467-001; May 5, 2014.
Molex; Imprerium HVHC Connector System product specification_J. Quiles_PS-171467-001; May 13, 2014.
Rclogger; RFID Balancing Charger, Description_http://www.rclogger.com/Innovations/RFID-Balancing-Charger-Dual-300W/RFID-Balancing-Charger-Dual-300W.html; May 20. 2014.
Rclogger; RFID Balancing Charger, Features_http://www.rclogger.com/Innovations/RFID-Balancing-Charger-Dual-300W/RFID-Balancing-Charger-Dual-300W.html; May 20, 2014.
Rclogger; RFID Balancing Charger, Gallery_http://www.rclogger.com/Innovations/RFID-Balancing-Charger-Dual-300W/RFID-Balancing-Charger-Dual-300W.html; May 20, 2014.
Rclogger; RFID Balancing Charger, Specs_http://www.rclogger.com/Innovations/RFID-Balancing-Charger-Dual-300W/RFID-Balancing-Charger-Dual-300W.html; May 20, 2014.
Tjintech; "All about lipo balance connectors"_http://www.tjinguytech.com/charging-how-tos/balance-connectors; Jun. 2, 2014.
Harrison, Mark; "Wiring multi-cell batteries"; http://eastbay-rc.blogspot.com/2010/12/wiring-multi-cell-batteries.html; Dec. 29, 2012.
Robbe; "BID System"; www.krikke.net; 2014-5-20.pdf.
Robbe Modell Sport; "BID System"; youtube.com-watch_v=llV8ieSNTBU; Mar. 5, 2012.
SBS Implementers Forum; "Smart Battery Data Specification"; smartbattery.org; Dec. 11, 1998.
SBS Implementers Forum; "Smart Battery Charger Specification"; smartbattery.org; Dec. 11, 1998.
SBS Implementers Forum; "Smart Battery System Manager Specification"; smartbattery.org; Dec. 15, 1998.
Mikado; "Vstabi Pionerr of Flybarless—Batt ID Battery Detection"; www.vstabi.info_node1740; Oct. 15, 2014.
Mikado; "Vstabi Pionerr of Flybarless—Battery ID for VBar Control"; www.vstabi.info_node1753;Nov. 29, 2014.
Mikado; "Battery ID Reader for VBar Control—Technical Data" v1.01; www.mikado-heli.de_VBarControAkkuIDLeser; 2014-11.pdf.
Lampert, Jon; "iMax X200" Sample pictures by author; May 15, 2015.
Hobby King; iMax "X200 Instruction"; www.hobbyking.com_914261155X365809X45; May 15, 2015.
Lampert, Jon; "Yunec Q500" Sample pictures by author; Mar. 13, 2015.

(56) References Cited

OTHER PUBLICATIONS

Amphenol; "Cool Power"; amphenolcanada.com; May 15, 2015.
Amphenol; "Data Center—Cool Power SlimDrawer"; http://www.amphenol-datacenter.com/PS-CoolPowerSlimDrawerhtm; May 15, 2015.
JST; "LBT-A Type Series"; May 15, 2015.
JST; "RIJ Connector" data sheet; May 15, 2015.
JST; "RWZ Connector" data sheet; May 15, 2015.
Panasonic; "B01 Stacking Connector for High Current" data sheet; May 15, 2015.
Positronic; "Scorpion Series Modular Power, Signal Connectors" catalog; May 15, 2015.
DuraTrax ONYX 100, AC/DC Peak Charger, Instruction Manual; 2009.
DuraTrax ONYX150, AD/DC Lipo Charger, Instruction Manual; 2012.
DuraTrax ONYX 200, AC/DC Sport Peak Charger; Instruction Manual; 2008.
Dynamite Prophet Sport II AC/DC Charger, Operation Manual; 2010.
Dynamite Prophet Plus II, AC/DC Powered Peak Detection Fast Charger; Manual; revised Dec. 2009.
Dynamite Prophet Sport Lipo; Instruction Manual; 2011.
Radient Ascend Multi-Chemistry AC/DC Peak Detection Balance Charger; Owner's Manual; 2011.
Radient Primal Multi-Chemistry AC Balance Charger; Owner's Manual; 2011.
Reedy 526-S Balance Charger; no date available.
TRAXXAS; Traxxas EZ-Peaks 5 AMP Fast Charger Instructions; 2013.

* cited by examiner

BATTERY CHARGER WITH USER INTERFACE

CROSS-REFERENCE TO RELATED APPLICATIONS

This application relates to co-pending U.S. Provisional Patent Application, Ser. No. 62/007,403 filed on Jun. 3, 2014, titled "Intelligent Battery-Powered System Connector", the entire contents of which are incorporated herein by reference for all purposes.

BACKGROUND OF THE INVENTION

Field of the Invention

The present invention relates to battery chargers, and, more particularly, to battery chargers for charging batteries having different charging attributes, features and/or requirements.

Description of the Related Art

Radio Controlled (RC) model vehicles appeal to people of all ages and skill sets. Many people who own RC vehicles do not understand all of the technical details about their vehicles or equipment, but only want to drive their vehicles and have fun. Using batteries that are not compatible with a particular battery charger may have catastrophic consequences for the battery, model vehicle, or charger. During daily use of RC model vehicles, multiple battery types and chemistry types may be used. Battery voltages can vary widely from less than 4.0V to greater than 25V. Many different battery chemistries are available; for example NiCd (Nickel Cadmium), NiMH (Nickel Metal Hydride), LiPO (Lithim Polymer) and Pb (Lead Acid). Each time a different type of battery is used, settings need to be modified on the battery charger (charge termination voltage, for example) to ensure the battery is not damaged. As customers and other users in the RC community use different types of batteries, it has become evident that most users are not properly educated on the differences and requirements of each different type; especially as it relates to the battery chemistry. A mismatch of settings on the battery charger may cause serious damage to property, particularly to the battery being charged. There is a need to reduce the danger of using a battery with an improperly paired device and reduce the amount of time it takes to modify the battery charger settings, that will not only improve user ability, but also add multiple layers of protection.

SUMMARY

The invention comprises one or more systems, methods, and apparatus for applying an appropriate and/or desired charge to one or more batteries.

BRIEF DESCRIPTION OF THE DRAWINGS

For a more complete understanding of the present invention and the advantages thereof, reference is now made to the following Detailed Description taken in conjunction with the accompanying drawings, in which.

DETAILED DESCRIPTION

Figure 1:
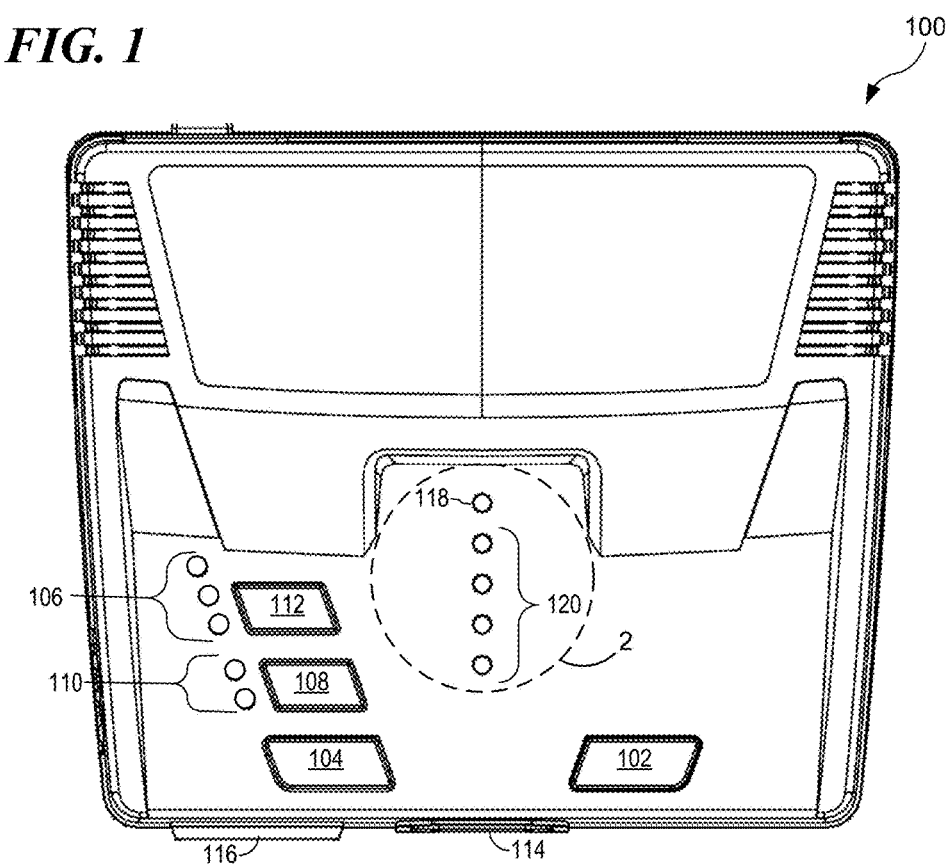
FIG. 1 is a top-down view of a first embodiment of a battery charger.

In the following discussion, numerous specific details are set forth to provide a thorough understanding of the present invention. However, the present invention may be practiced without such specific details. In other instances, well-known elements have been illustrated in schematic or block diagram form in order not to obscure the present invention in unnecessary detail. Additionally, and for the most part, details concerning well-known features and elements have been omitted inasmuch as such details are not considered necessary to obtain a complete understanding of the present invention. Specifically, details concerning electronic communications, electro-magnetic signaling techniques, RFID, battery charge current generation and control, methods of battery charging, and the like, have been omitted.

A single battery charger may accommodate rechargeable batteries of different chemistries, such as accommodating both Li-type and Ni-type batteries, for example. The battery charger may be configured to implement charge parameter settings received from a coupled battery to be charged. The battery charger may also be configured to implement default charge parameter settings in response to detected conditions. The battery charger may also be configured to receive user input for adjusting and/or entering charge parameter settings.

Lithium Polymer (LiPo) batteries equipped with RFID technology and integrated balance taps may communicate with a device such as a battery charger equipped with similar technology providing information such as chemistry type, cell count, recommended charge rates, number of charges on the battery, among other types of information. Safety features may include:

the ability for the RFID tag to program a charger once the tag is read, allowing for single push-button charging; an integrated balance tap may reduce the need for multi-process charging setups;

the balance taps may be used in conjunction with the RFID tag information to add additional layers of battery cell type confirmation;

a short antenna range on the RFID reader may reduce interference from surrounding items;

the RFID reader may read and register one tag to reduce errors in information transfer; and the system may be designed to read RFID tag information before an electrical connection is made. For example, reading the RFID tag information may be pre-requisite to charging an RFID. In an embodiment, the RFID reader may see the RFID tag before the positive and negative terminals of the connector make contact with a paired device, such as a battery charger, for example.

In an embodiment, a battery charger 100 according to the present invention may comprise a charger output port for coupling with a battery to be charged, a sensor device and reader for receiving information from the battery to be charged, one or more balance ports for balance charging, a plurality of switches for receiving user input, a plurality of status indicators, and a plug for connecting the battery charger to a power supply. In alternative embodiments the battery charger may be provided with additional, fewer, or different components.

The battery charger 100 may be configured to be compatible with rechargeable batteries of several types. For example, the battery charger may be configured to be capable of charging both NiMH type and LiPo type batteries. The battery charger 100 may further be configured to be capable of charging different sized batteries of each type. For example, in a specific embodiment, the battery charger 100 may be configured to be compatible with NiMH batteries of either 2/3 A or Sub-C sizes, as well as LiPo battery packs of 2S and 3S sizes.

The listed examples are intended to be illustrative only. In alternative embodiments, the battery charger 100 may be configured to be capable of charging batteries of different types and sizes than those listed above. Specifics regarding each battery type and size are omitted from this description as such details are not considered necessary to obtain a complete understanding of the present invention, and are considered to be within the understanding of persons of ordinary skill in the relevant art.

Figure 4:
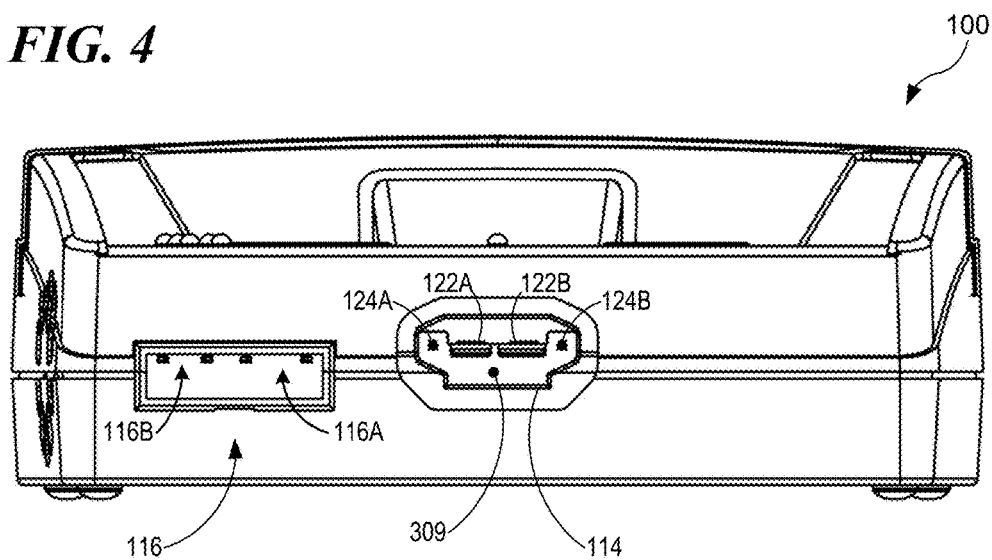
FIG. 4 is a front view of a battery charger according to the embodiment of FIG. 1.

As shown in FIGS. 1 and 4, in an embodiment, a battery charger 100 may comprise a charger output port 114 for electrically coupling a rechargeable battery to the battery charger 100. In an embodiment, the charger output port 114 may be an electrical connector such as an electrical socket or receptacle for receiving an electrical plug coupled to a battery to be charged, for example. According to the embodiment shown, the charger output port 114 may comprise an electrical socket comprising an insulating material and implemented with two male terminals 122A and 122B for receiving a female electrical connector 152 of a rechargeable battery 150. In an embodiment, the charger output port 114 may be provided with balancing terminals 124A and 124B, which connect to LiPo Balancing Circuit 312, shown in FIG. 9. The battery charger 100 may be configured to provide a charging current to a rechargeable battery through the charger output port 114 upon user initiation of charging operation while the rechargeable battery is electrically connected to the charger output port 114.

In an embodiment, the battery charger 100 may be configured to be compatible with only batteries of one or more specific types. The socket shape of the output charge port 114 may be implemented with one or more keying features for preventing incompatible batteries from electrically coupling with the battery charger 100. Specific keying features that may be provided are discussed further in U.S. Provisional Patent Application, Ser. No. 62/007,403 filed on Jun. 3, 2014, titled "Intelligent Battery-Powered System Connector" the entire contents of which are incorporated herein by reference for all purposes.

Female electrical connector housings, having various keying and coupling features, are now described. A battery to be charged may be implemented with a female connector implemented with a female connector having a housing 1802, 1902, or 2002, and implemented with one or more of the features described below. The charger output port 114 may be configured to be compatible with female connector housings of the types described below. The battery charger 100 may be configured with a charger output port 114 which may be a socket implemented with one or more features corresponding to features of the female connector housings described. Specifically, the charger output port 114 may be implemented with complimentary keying features, balance tab, or terminal, features, and an RFID communication device, or devices, to those of the female connector housings 1802, 1902, and 2002. The battery charger 100 may, therefore, be configured to receive and charge a battery having female connector housings implemented with none, some, or all of the keying features and balance terminals described below in reference to housings 1802, 1902, and 2002.

Figure 2:
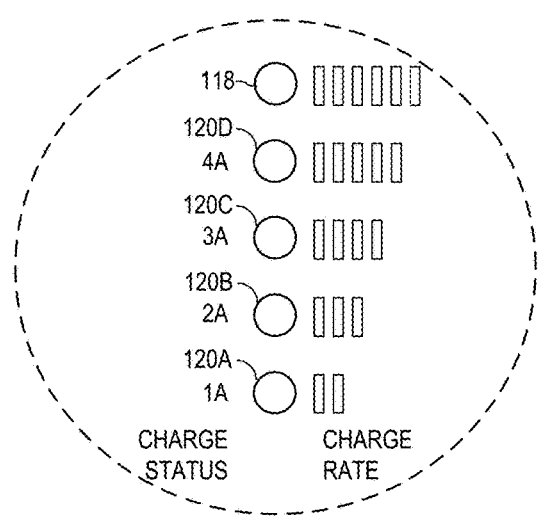
FIG. 2 is a detail view showing the status indicators of a battery charger according to the embodiment of FIG. 1.
Figure 3:
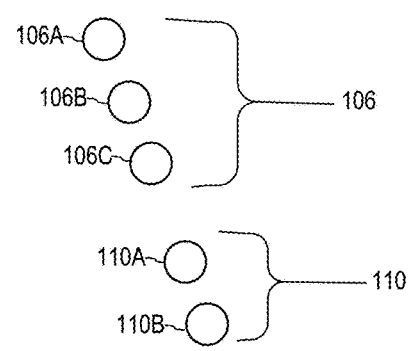
FIG. 3 is a detail view showing charging parameter selection indicators of a battery charger according to the embodiment of FIG. 1.
Figure 18:
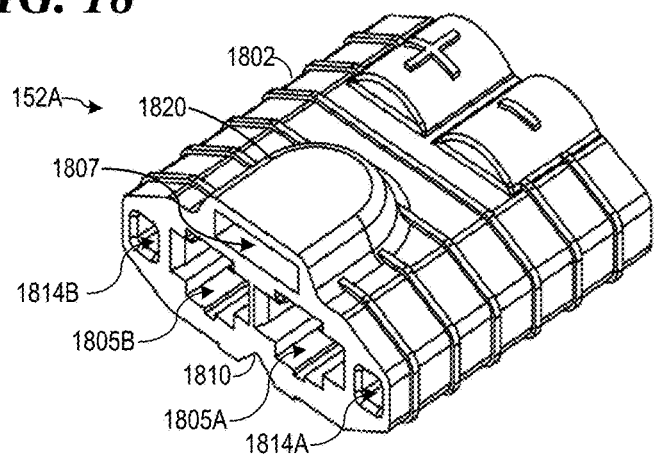
FIGS. 18-20 are a perspective views of female electrical connectors having certain keying features.

Turning now to FIG. 18, a female electrical connector 152C may include a housing 1802. The housing may have an elevated structure 1820 on a top side of the connector 152A and adjacent one end of the connector housing 1802. The elevated structure 1820 may partially enclose a cavity 1807 for receiving an RFID tag 206, as shown in FIG. 1-3. Adjacent the same end of the housing 1802 as the cavity 1807 there may be provided first and second main receptacles 1805A and 1805B, respectively. Adjacent the same end of the housing 1802 there may also be provided first and second channels 1814A and 1814B, respectively, for receiving balancing terminals 124A and 124B, as shown in FIG. 4. A keying feature 1810 may be provided in the housing 1802, and may comprise a V-shaped groove running along the center of a bottom side of the connector 1800, for example.

Figure 19:
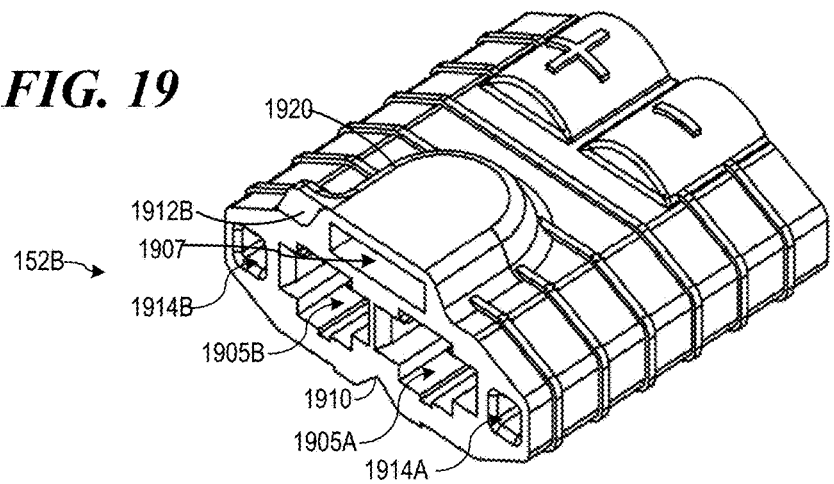

Turning now to FIG. 19, a female electrical connector 152B has a housing 1902 as described hereinbefore. The housing may have an elevated structure 1920 on a top side of the connector 152B and adjacent one end of the connector housing 1902. The elevated structure 1920 may partially enclose a cavity 1907 for receiving an RFID tag 206, as shown in FIG. 1-3. Adjacent the same end of the housing 1902 as the cavity 207 there may be provided first and second main receptacles 1905A and 1905B, respectively. Adjacent the same end of the housing 1902 there may also be provided first and second channels 1914A and 1914B, respectively, for receiving balancing terminals 124A and 124B, as shown in FIG. 4. A first keying feature 1910 may be provided in the housing 1902, and may comprise a V-shaped groove running along the center of a bottom side of the connector 152B, for example. A second keying feature 1912B may be provided, for example, on a top side of the connector 152B, and may be a protrusion extending from one side of elevated structure 1920 in the direction of receptacle 1905B and channel 1914B.

Figure 20:
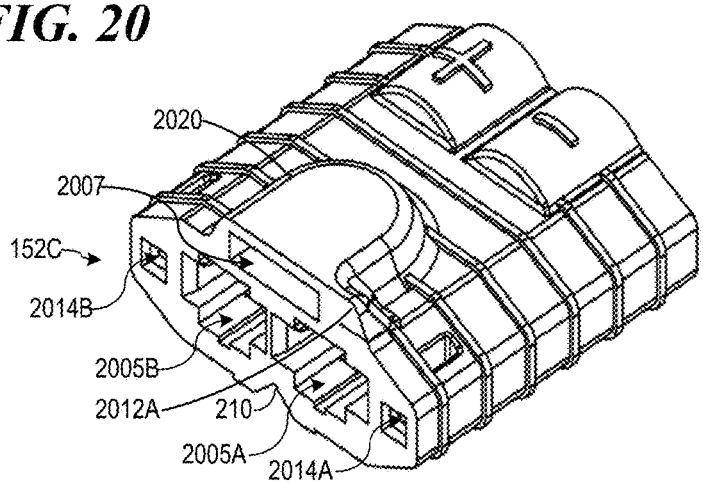

Turning now to FIG. 20, a female electrical connector 152C has a housing 2002 as described hereinbefore. The housing may have an elevated structure 2020 on a top side of the connector 152C and adjacent one end of the connector housing 2002. The elevated structure 2020 may partially enclose a cavity 2007 for receiving an RFID tag 206, as shown in FIG. 1-3. Adjacent the same end of the housing 2002 as the cavity 207 there may be provided first and second main receptacles 2005 and 2005B, respectively. Adjacent the same end of the housing 2002 there may also be provided first and second channels 2014A and 2014B, respectively, for receiving balancing terminals 124A and 124B, as shown in FIG. 4. A first keying feature 2010 may be provided in the housing 2002, and may comprise a V-shaped groove running along the center of a bottom side of the connector 200A. A second keying feature 2012A may be provided, for example, on a top side of the connector 152C, and may be a protrusion extending from one side of elevated structure 2020 in the direction of receptacle 2005A and channel 2014A.

The charger output port 114 may be implemented with a sensor device 309, which may be coupled to an RFID reader 308, and which may be disposed along an inner surface of the electrical socket of charger output port 114. In an embodiment, the sensor device 309 may be an antenna coupled to the RFID reader 308 for receiving and transmitting data to the RFID reader 308. In some embodiments, the sensor device 309 and the RFID reader 308 may comprise a single component.

The output charge port 114 may comprise a socket composed of an insulating material. The insulating material of the socket may extend over an exposed length of the male terminals 122A and 122B. In such an embodiment, an RFID reader 308 and/or sensing device 309 may be disposed within the portion of the inner surface of the socket extending along the exposed length of the male terminals. Specific details regarding the location of the RFID reader 308 and sensing device 309 within the socket of the charge output port 114 may be found in U.S. Provisional Patent Application, Ser. No. 62/007,403 filed on Jun. 3, 2014, titled "Intelligent Battery-Powered System Connector" the entire contents of which are incorporated herein by reference for all purposes.

Figure 21:
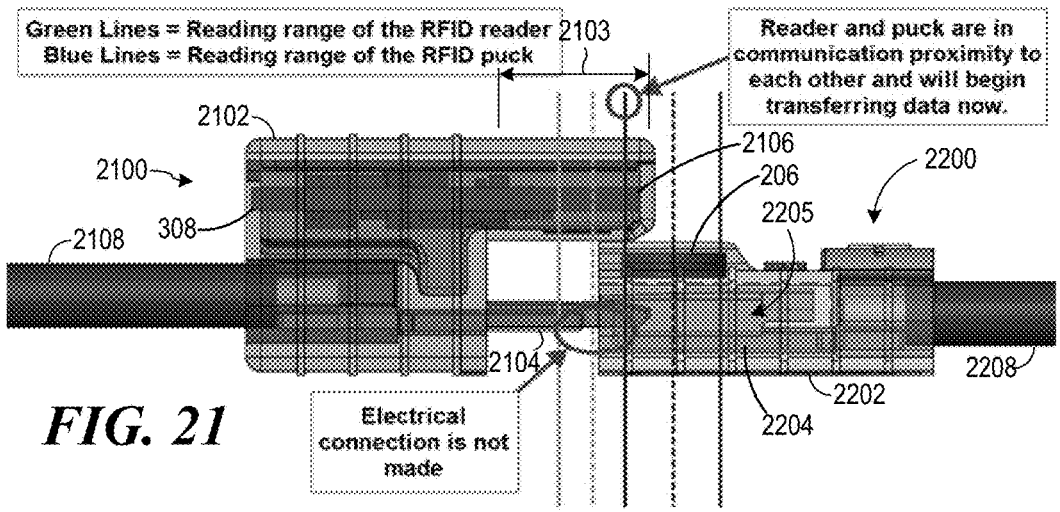
FIG. 21-23 are side, phantom views of male and female electrical connectors illustrating three stages of mating.
Figure 22:
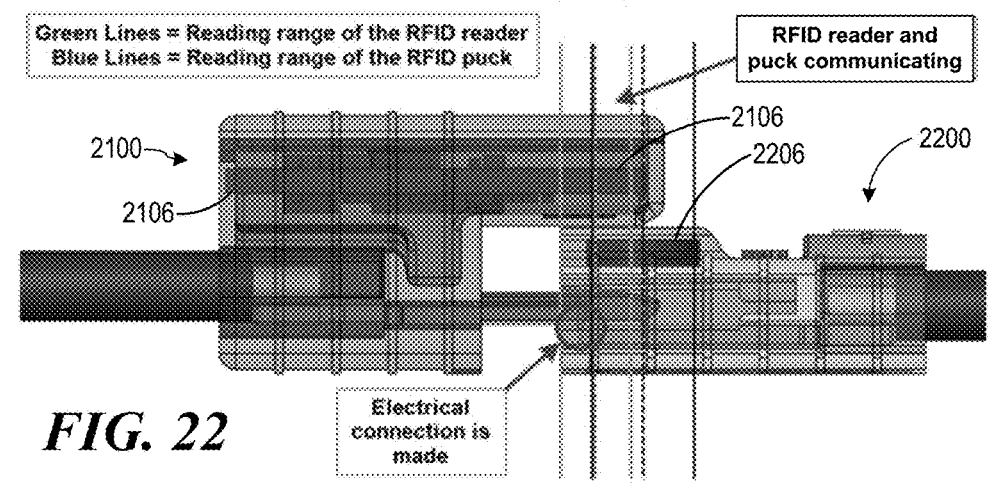
Figure 23:
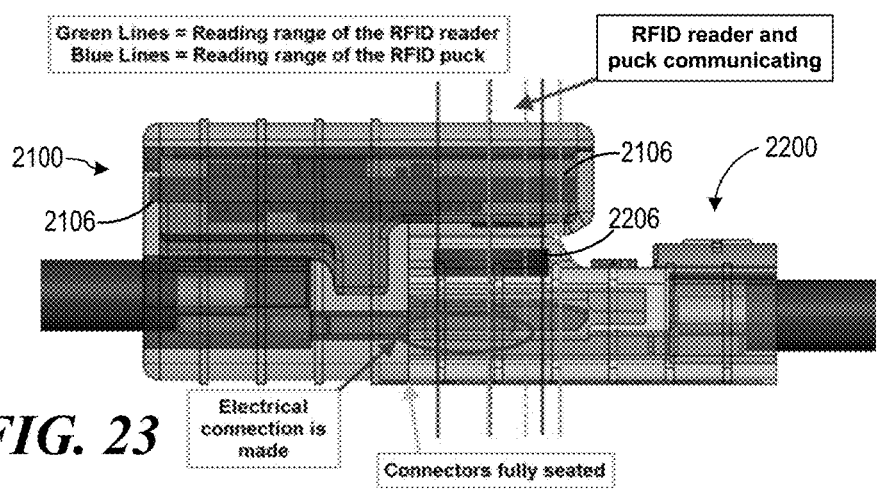

Turning now to FIGS. 21-23, a male electrical connector 2100 is shown in a phantom view engaging with a female electrical connector 2200, also shown in phantom view. An RFID equipped battery may comprise a female electrical connector 2200. An RFID equipped battery charger 100 may comprise a male electrical connector 2100. The male electrical connector 2100 may comprise an insulated housing 2102 containing at least one male electrical terminal 2104 extending from a portion of the housing 2102. In an embodiment, there may be two male electrical terminals 2104 for connecting to positive and negative electrical circuits, respectively. The housing 2102 may extend over an exposed length of the male electrical terminals 104, the extended portion 2103 for enclosing an RFID reader 308 and/or sensing device 309. It is well understood that the RFID reader 308 may be electrically connected to a smart device by suitable wiring (not shown). The male electrical terminals 2104 may be coupled to high-current capacity wiring 2108, such as 12AWG wires, for example.

The female electrical connector 2200 may comprise an insulated housing 2202 containing at least one female electrical terminal 2204 partially enclosed within a receptacle portion 2205 of the housing 2202. In an embodiment, there may be two female electrical terminals 2204 each at least partially enclosed within its own, separate receptacle portion 2205, for connecting to positive and negative electrical circuits, respectively. The housing 2202 may enclose an RFID tag 206. The female electrical terminals 2204 may be coupled to high-current capacity wiring 2208, such as 12AWG wires, for example.

When an RFID equipped battery is starting to be coupled to an RFID equipped charger, the RFID tag 206 and RFID reader 308 may establish an RF connection and start to communicate and transmit information, as illustrated in FIG. 21. As the electrical connectors 2100 and 2200 are pushed closer together, an electrical connection is made after the RFID tag 206 and RFID reader 308 have established an RF connection. Alternatively, the RFID reader 308 may not attempt to establish communications with the RFID tag 206 until electrical connection is made. Either way, the RFID tag 206 can be expected to be within range of the RFID reader 308 and/or or sensing device 309, when an electrical connection is made. At this point, the battery charger may be enabled to operate.

The connector may be configured such that the RFID tag 206 may establish an RF connection with RFID reader 308 before an electrical connection is made to prevent improper usage of an RFID equipped battery, as illustrated in FIG. 22. If the connectors 2100 and 2200 are fully coupled, the RFID connection is still maintained. In an embodiment, there is no point where the RFID system does not maintain an RF connection while an electrical connection is made between the battery and the paired device, as illustrated in FIG. 23. In an embodiment, the RFID reader 308 may read the RFID tag 206 when the male and female connectors 2100 and 2200, respectively, are being coupled and the RFID tag 206 is enclosed within housing 2202, and may continue to read while the male and female connectors 2100 and 2200, respectively, are coupled. In another embodiment, the RFID reader 308 may be configured to read the RFID tag 206 located in other positions relative to the female connector 2200, such as being mounted on an exterior surface of the connector, for example, or any other suitable location.

In an embodiment, the battery charger 100 may be configured to electrically couple with batteries comprising a female electrical connector that may comprise an insulated housing and two female terminals. The battery charger 100 may be further configured to electrically couple with batteries having a female connector further comprising an RFID tag 206. In such an embodiment, the battery charger may be configured to also be compatible with batteries having a female connector not comprising an RFID tag 206. In such an embodiment, the battery charger may be configured to respond in a different manner when electrically coupled to a battery implemented with an RFID tag 206 than the manner that the battery charger 100 is configured to respond when electrically coupled to a battery without an RFID tag 206, as described later in this specification.

The RFID reader 308 and/or sensing device 309 may be disposed within the socket of the output charge port 114 and female electrical connector, respectively, such that the RFID tag 206 may be within range of the RFID reader 308 and/or sensing device 309 during and while an electrical connection is made between the battery and the battery charger 100. An RF connection may be established as the female electrical connector of a battery is inserted into the socket of the charge output port 114. The RF connection may be maintained during the time in which the female electrical connector of the battery is electrically coupled to the battery charger 100.

The RFID reader 308 may be configured to attempt to establish communications with the RFID tag 206 upon sensing the RFID tag 206 or, alternatively, only after an electrical connection is made between the battery and the battery charger 100. In an embodiment, the battery charger 100 may enable charging of an RFID equipped battery only after an RF connection is made, to prevent improper charging of the RFID equipped battery.

When an RFID equipped battery is coupled to the RFID equipped battery charger 100, the RFID tag 206 and RFID reader 308 and/or sensing device 309 may establish an RF connection and start to communicate and transmit information to an RFID reader. Information contained on the RFID tag 206 may comprise a manufacturer assigned identifier number, or code, unique to the specific battery model, or unique to the battery, itself. Additionally, in alternative embodiments, further information such as chemistry type, cell count, recommended charge rates, number of charges on the battery, among other information, may be contained on the RFID tag 206 and read by the RFID reader 308 and/or sensing device 309 of battery charger 100. The battery charger 100 may use the information received to configure the charge current and charge operation of the battery charger 100, allowing for single push-button charging of batteries having a recognized RFID tag 206.

Figure 5:
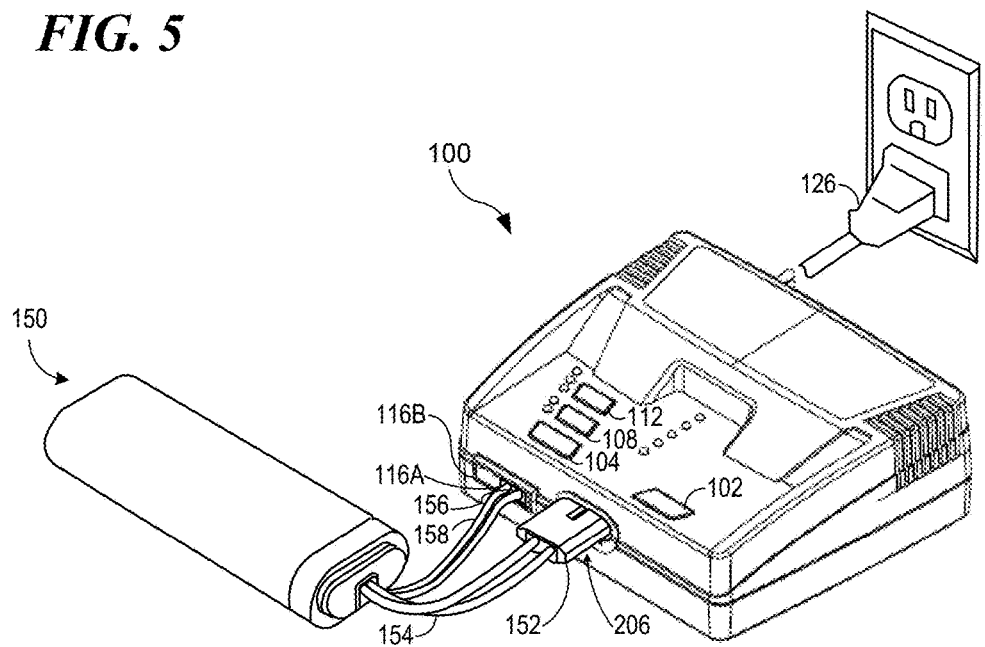
FIG. 5 is a perspective view of a battery charger according to the embodiment of FIG. 1.

As shown in FIGS. 1, 4, and 5, the battery charger 100 may be implemented with balance connector ports 116A and 116B for electrically coupling with a balance connector of a battery to be charged. The balance connector ports 116A and 116B may electrically couple with one or more balancing circuits enclosed within the battery charger 100 for use during balance charging of a Lithium-type battery, such as a LiPo battery, for example.

In the particular embodiment shown, the battery charger may implemented with two balance connector ports 116A and 116B, which may be configured to have different sizes for accommodating batteries of different sizes. In the embodiment shown, the balance connector port 116A may be configured to accommodate a 2S LiPo battery, while the balance connector port 116B may be configured to accommodate a 3S LiPo battery. In alternative embodiments, the battery charger 100 may be implemented with additional, or fewer, balance connector ports 116. Further, in an alternative embodiment, the battery charger 100 may be implemented with balance connector ports of different sizes for accommodating larger LiPo batteries.

As shown in FIG. 5, in an embodiment, the battery charger 100 may be configured to receive both a female electrical connector and a balance connector of the battery to be charged when balance charging a LiPo battery. In an embodiment, the battery charger 100 may be configured to electrically couple to a 2S balance connector using the balance connector port 116A. In such an embodiment, the battery charger 100 may be further configured to electrically couple to a 3S balance connector using the balance connector port 116B.

In some embodiments, the battery charger 100 may be implemented with logic for adjusting one or more charger settings, such as the Battery Type, the Charge Mode, or the Charge Rate, each of which are described below, in response to a balance connector being electrically coupled to one of the balance connector ports 116 of the battery charger 100. For example, a battery charger 100 implemented with a Battery Type selector may be configured to set the Battery Type to "LiPo" in response to a balance connector being electrically coupled to one of the balance connector ports 116. Further, a battery charger 100 implemented with a Charge Type selector may be configured to set the Charge Type to "Balance" in response to a balance connector being electrically coupled to one of the balance connector ports 116. A battery charger 100 implemented with a Charge Rate selector may be configured to set the Charge Rate to a pre-determined value, such as "4 A", for example, in response to a balance connector being electrically coupled to one of the balance connector ports 116.

According to embodiment shown in FIG. 1, a battery charger 100 may comprise four switches: a first switch 102, a second switch 104, a third switch 108, and a fourth switch 112. Each switch may receive user input to set one or more charging parameters of the battery charger 100. As shown in FIG. 1, each switch may comprise a push button. In alternative embodiments, the switches may comprise any combination of push buttons, toggle switches, radial switches, and the like. Further, in an alternative embodiment, the battery charger may be implemented with additional or fewer switches than shown in FIG. 1 or, alternatively, may be implemented with switches incorporated into a touch screen display.

As shown in FIG. 1, the first switch 102 of the battery charger 100 may be a push button switch providing the user "start/stop" control over the delivery of a charging current by the battery charger 100. The first switch 102 may be configured to initiate delivery of a charging current by the battery charger 100 to a battery to be charged, starting charging of the battery, upon depression of the first switch 102 by the user. In addition, the first switch 102 may be configured to terminate delivery of a charging current to a battery to be charged, thereby stopping charging of the battery, upon a subsequent depression of the first switch 102 by the user. In this manner, the first switch 102 may be used by the user to toggle the battery charger 100 between charging and non-charging operation. In an embodiment, the first switch 102 may be configured to toggle the battery charger 100 between charging and non-charging operation in response to the first switch 102 being held in the depressed position for a specified amount of time, for example, two seconds.

The first switch 102 may also be configured to operate as a status indicator, illuminating to indicate a status or condition of the battery charger 100. The first switch 102 may comprise a material configured to allow light to pass through it and be positioned over a light emitting diode (LED) housed within the battery charger 100. Upon the occurrence of a specific status or condition of the battery charger 100, the LED may be illuminated, causing the first switch 102 to illuminate and indicating to the user the occurrence of a status or condition of the battery charger 100.

In an embodiment, for example, the first switch 102 may illuminate during times when the battery charger 100 has received information from a battery to be charged through a sensor device of the battery charger 100. In a particular embodiment, the battery to be charged may be comprise an RFID chip, for example, with the first switch 102 configured to illuminate in response to the battery charger 100 receiving the information contained on the RFID chip of the battery to be charged. In such an embodiment, the first switch 102 may be further configured to not illuminate, or, alternatively, illuminate in a second mode, perhaps in a different color or flashing on and off, for example, when a battery is electrically coupled to the battery charger and no information is received by the sensor from the battery to be charged.

As shown in FIG. 1, the battery charger 100 may be implemented with a second switch 104 which may be a push button switch for allowing the user to select a "Charge Rate." The Charge Rate selected may set the amperage (A) of the charge current to be provided by the battery charger 100 to a battery to be charged. As shown in the embodiment of FIG. 1, the battery charger 100 may be configured with four "Charge Rate" options: 1 A; 2 A; 3 A; or 4 A. In an alternative embodiment, the battery charger 100 may be implemented with additional, or fewer, Charge Rates with larger, or smaller, steps between adjacent selection amperage values. In a further alternative, the Charge Rate may be selected from a continuous range of amperage values.

The second switch 104 may be configured to cycle through the Charge Rate options, incrementally changing the selection with each press of the second switch 104 by the user. In an alternative embodiment, the second switch 104 may be a toggle switch, radial switch, or the like, with the user moving the second switch 104 to the position corresponding to a desired mode selection.

The battery charger 100 may also be configured with default settings implemented in response to a battery of a specific battery chemistry being connected to the battery charger 100. For example, the battery charger 100 may be configured to default to the "4 A" Charge Rate setting when the battery charger 100 detects that a NiMH battery is connected to the battery charger 100. In such an embodiment, the battery charger 100 may be configured to detect the NiMH-type battery through information received from the connected battery through a sensor device of the battery charger 100, or, alternatively, in response to user selection of the NiMH Battery Type using the third switch 108, as described above.

The battery charger 100 may be implemented with logic for allowing the user to "unlock" the battery charger 100, allowing the user to override or input charge parameter settings while a battery is coupled to the battery charger 100. This may be regarded as using the battery charger 100 in "Advanced Mode." The battery charger 100 may be implemented with logic for entering "Advanced Mode" in response to a specific user action, such as pressing and holding both the "Start/Stop" and "Charge Rate" pushbuttons simultaneously for 2 seconds, for example. Further, the battery charger 100 may be configured to indicate that "Advanced Mode" has been entered, such as by causing one or more indicators 120 to flash, for example. Specific instances when "Advanced Mode" may be used and the capabilities "unlocked" by entering "Advanced Mode" are described later in this description.

As shown in FIG. 1, the battery charger 100 may be implemented with a third switch 108 which may be a push button switch for allowing the user to select a "Battery Type." The third switch 108 may be configured to cycle through the available types, incrementally changing the selection with each press of the third switch 108 by the user. In an alternative embodiment, the third switch 108 may be a toggle switch, radial switch, or the like, with the user moving the third switch 108 to the position corresponding to a desired type selection.

As shown in FIG. 1, the battery charger 100 may be configured with two "Battery Type" options: Lithium-polymer ("LiPo") and Nickel-metal hydride ("NiMH"). In alternative embodiments, the battery charger 100 may be implemented with additional, or fewer, Battery Types. For example, the battery charger may be configured to charge rechargeable batteries of other known chemistries comprising the prior art, such as Lithium-iron (LiFe), Lithium-ion, Nickle-cadmium (NiCd), and the like.

The battery charger 100 may be configured with default settings implemented in response to a battery of a specific type being connected to the battery charger 100. For example, the battery charger 100 may be configured to default to the LiPo type in response to receipt of a balance port connector at a balance port of the battery charger 100.

As shown in FIGS. 1 and 3, the battery charger 100 may be implemented with one or more Battery Type selection indicators 110A and 110B, which may be LEDs, for indicating the Battery Type selected. The battery charger 100 may be configured to illuminate the LED corresponding to the currently selected Battery Type. In an alternative embodiment, additional, fewer, or no Battery Type selection indicators 110 may be provided. For example, in an embodiment utilizing a radial switch for Battery Type selection, no Battery Type selection indicators may be provided. In another embodiment, a single indicator 110 may be provided and configured to illuminate a different color corresponding to each of the possible Battery Types.

As shown in FIG. 1, the battery charger 100 may be implemented with a fourth switch 112 which may be a push button switch for allowing the user to select a "Charge Mode." The fourth switch 112 may be configured to cycle through the available modes, incrementally changing the selection with each press of the fourth switch 112 by the user. In an alternative embodiment, the fourth switch 112 may be a toggle switch, radial switch, or the like, with the user moving the fourth switch 112 to the position corresponding to a desired mode selection.

As shown in FIG. 1, the battery charger 100 may be configured with three "Charge Mode" options: Store, Fast, and Balance. Store mode may charge or discharge a battery connected to the battery charger 100 to bring the battery to a storage voltage and may be used for preparing a battery for a period of nonuse. Fast mode may charge a battery to the peak voltage of the battery. Charging in fast mode may terminate upon the first cell of a multi-cell battery reaching the peak voltage. Balance charge may charge a multi-cell battery to a peak voltage while maintaining uniform charge among the multiple battery cells. For each of the above-described modes, charging or discharging may be accomplished through peak voltage detection, through constant-voltage and constant-current (CVCC) charging, or any other known methods of battery charging comprising the prior art. In an embodiment, the battery charger 100 may be implemented with additional, or fewer, Charge Modes.

Further, in an embodiment, the battery charger 100 may be configured to allow selection of one or more of the Charge Modes only when a battery of a specific chemistry is to be charged. For example, the battery charger 100 may be configured to prevent selection of "balance" charge unless a Lithium polymer (LiPo) type battery is connected to the battery charger 100. Further, the battery charger 100 may be configured to enable the Charge Mode function when a battery of a specific type is to be charged. For example, the battery charger 100 may utilize the Charge Mode selection function only when a LiPo type battery is to be charged, with the Charge Mode selection function not configured to be used when the NiMH Battery Type is selected. In an embodiment according to the last example, the "Charge Mode" button may be implemented with "LIPO" label to indicate the Charge Mode is only configurable at times when a LiPo type battery is connected to the battery charger 100.

The battery charger 100 may also be configured with default settings implemented in response to a battery of a specific battery chemistry being connected to the battery charger 100. For example, the battery charger 100 may be configured to default to the Balance Charge Mode when the battery charger 100 detects that a LiPo battery is connected to the battery charger 100. In such an embodiment, the battery charger 100 may be configured to detect the LiPo-type battery through information received from the connected battery through a sensor device of the battery charger 100, or, alternatively, in response to receipt of a balance port connector at a balance port of the battery charger 100.

As shown in FIGS. 1 and 3, the battery charger 100 may be implemented with one or more Charge Mode selection indicators 106A-C, which may be LEDs, for indicating the Charge Mode selected. The battery charger 100 may be configured to illuminate the LED corresponding to the currently selected Charge Mode. In an alternative embodiment, additional, fewer, or no Charge Mode selection indicators 106 may be provided. For example, in an embodiment utilizing a radial switch for Charge Mode selection, no Charge Mode selection indicators may be provided. In another embodiment, a single indicator 106 may be provided and configured to illuminate a different color corresponding to each of the possible Charge Modes.

As shown in FIGS. 1 and 2, the battery charger 100 may be implemented with one or more indicators 118 and 120. The indicators 118 and 120, which may be one or more LEDs, may be configured to indicate the Charge Status, the selected Charge Rate, and the Charge Progress. In alternative embodiments, the indicators 118 and 120 may be configured to indicate additional, fewer, or different statuses of the battery charger.

According to the embodiment shown, the battery charger 100 may be implemented with a Charge Status indicator 118 comprising a single LED. In such an embodiment, the Charge Statues indicator may be configured to illuminate in one or more modes for indicating different statuses of the battery charger 100. In an embodiment, the charge mode indicator may illuminate in a first mode during at least a portion of the charging mode and in a second mode when charging is completed, for example. In an embodiment, the mode indicator may illuminate in a third mode if no information is received by the sensor when the electrical connector is coupled to the battery to be charged, for example. In an alternative embodiment, more than one Charge Status indicator 118 may be provided, with the illumination pattern of the one or more indicators 118 indicating a battery charger 100 status.

In an exemplary embodiment implemented with a single LED Charge Status indicator 118, the Charge Status indicator 118 may be configured to flash on and off during times when the battery charger 100 is providing a charging current to a battery to be charged. In such an embodiment, the Charge Status indicator 118 may be further configured to remain illuminated upon completion of charging of a battery. In alternative embodiments, different modes of illumination may be provided to indicate one or more Charge Statuses to the user. For example, the color of light emitted by the Charge Status indicator 118 may vary to indicate different battery charger 100 statuses.

According to the embodiment shown in FIGS. 1 and 2, the battery charger 100 may be implemented with a plurality of indicators 120, which may be LEDs, for indicating the Charge Rate and/or the Charge Progress. In an embodiment, the charging status indicators 120A-120D may be a plurality of light emitting devices illuminating in succession to indicate the amount of electrical charge delivered to a battery to be charged, for example. As noted above, the Charge Rate may be the amperage of the charging current provided by the battery charger 100 to a battery. The Charge Progress may be an indication of the current charge level of the battery being charged. The Charge Progress may be displayed as a ratio, or percentage, of current charge to peak charge or, alternatively, may be displayed as symbols indicating a progressive increase in charge amount.

As shown, the battery charger 100 may comprise four Charge Rate/Progress indicators 120A-D. Each Charge Rate/Progress indicator 120 may be implemented with one or more labels, as shown in FIG. 2, specifying a Charge Rate and/or Charge Progress value. For example, indicator 120A may be provided with a "1 A" label for indicating a 1 amp Charge Rate as well as a symbol indicating a relative amount of charge contained by a battery being charged, the Charging Progress. In alternative embodiments, the battery charger 100 may be implemented with more, or fewer indicators 120 configured to indicate additional, fewer, or different statuses or conditions of the battery charger 100.

During times when the battery charger 100 is connected to a battery but is not providing a charging current, the battery charger 100 may be configured to indicate the selected Charge Rage by illuminating the Charge Rate/Progress indicator 120A-D corresponding to the selected Charge Rate. The battery charger 100 may be further configured to illuminate the Charge Rate/Progress indicators 120 to indicate the currently selected Charge Rate only during times when the battery charger 100 has received information from the battery through the sensor device and prior to commencement of providing a charging current to the battery. At such times the Charge Rate indicator 120A-D illuminated may change with each press of the fourth switch 112 by the user, cycling through the Charge Rate options as described above.

In some embodiments, the battery charger 100 may be implemented with logic permitting the Charge Rate selected to be indicated to the user during charging of a battery. In such embodiments, the battery charger 100 may be configured to illuminate only the Charge Rate/Progress indicator 120 corresponding to the currently selected Charge Rate in response to user input during charging, such as in response to the user pressing the "Charge Rate" button during charging, for example. The battery charger 100 may be configured to display the current Charge Rate in the manner described above for a specified period of time, such as for five seconds, perhaps. In addition, the battery charger 100 may be configured to illuminate the Charge Status indicator 118 in a solid mode during the time in which the Charge Rate selection may be indicated during charging of a battery.

The battery charger 100 may be further configured to indicate the Charge Progress at times when the battery charger 100 is providing a charging current to a battery through illumination of the Charge Rate/Progress indicator, or indicators, 120A-D corresponding to the amount of charge contained the battery being charged. For example, and according to the embodiment shown, during a complete charging of a battery having no charge initially, the Charge Rate/Progress indicators 120A-D may illuminate in succession with indicator 120A illuminating first, indicating the battery has little or no charge, perhaps with the battery charge being below 20% of the peak voltage charge. As the battery charge increases during charging, additional indicators 120 may illuminate. According to the present example, indicators 120A and 120B may both illuminate upon the battery charge reaching a threshold charge amount, perhaps 40% of peak voltage. Similarly, indicator 120C may illuminate upon the battery charge reaching 60% of peak voltage and 120D at 80%. At full charge, the battery charger 100 may be configured to illuminate the Charge Status indicator 118 according to a specific mode, or pattern, as described above.

The Charge Status indicator 118 and Charge Rate/Progress indicators 120A-D may be further configured to illuminate in an alternative manner, such as sweeping back-and-forth or collectively flashing, for example, at times when the battery charger 100 is connected to a battery and the sensor device 309 has not received any information from the battery. Additionally, the Charge Rate/Progress indicators 120A-D may be configured to illuminate in a specific mode at start up for indicating to a user that the battery charger 100 is powered up and waiting to be coupled to a battery to be charged. For example, the battery charger 100 may be configured to illuminate the Charge Rate/Progress indicators 120A-D in a "runway" pattern at start up, or, additionally, at any time that the battery charger is capable of charging and awaiting coupling to a battery to be charged, such as upon disconnection of a battery that has just been charged.

The battery charger 100 may be implemented with logic for displaying error codes to a user through illumination of the indicators 118, 120, 106, and/or 110, as appropriate, according to defined modes. The error codes may be displayed by flashing or blinking the indicators, for example. Referring to Table 1, below, several examples of error codes and illumination modes are shown. Specifics regarding detection and effects of each error code are omitted inasmuch as such details are not considered necessary to obtain a complete understanding of the present invention, and are considered to be within the understanding of persons of ordinary skill in the relevant art. The listing in Table 1 is illustrative, only. In an embodiment, additional, fewer, or different error codes and illumination modes may be provided.

TABLE 1

ERROR CODES

| ILLUMINATION MODE | ERROR EXPLANATION | SOLUTION: |
|---|---|---|
| 120D, flashing | Detected battery type does not match the Battery Type selection | Press the START/STOP/ button; verify the battery matches the selected type; verify balance connector is plugged in (if required) |
| 120C, flashing | Battery or cell voltage is too high or too low to charge safely | Verify balance connector is plugged in (if required); disconnect battery and check condition |
| 120B, flashing | Charge cycle timed out without reaching the target battery voltage. | Disconnect battery and check condition. |
| 120A, flashing | A preferred battery iD is detected but not readable by the battery charger. | Contact customer support |
| 120B-D, flashing | The battery charger internal temperature is too high. | Power off the battery charger to allow charger to cool off. |

As shown in FIG. 5, the battery charger 100 may be implemented with a plug 126 for operably connecting the battery charger 100 to an external power supply. In the embodiment shown, the plug 126 may comprise a standard A/C plug for insertion into a wall outlet.

Additionally, in some embodiments, the battery charger 100 may be implemented with an audible enunciator device (not shown), such as a speaker. In such embodiments, the audible enunciator device may be configured to alert the user of changes in a status or condition of the battery charger 100. For example, the battery charger 100 may be implemented with a speaker for making a sound, such as a tone, beep, or the like, to indicate that the battery charger 100 has completed charging a battery. Additionally, the speaker may be configured to produce alternative sounds for indicating other statuses, or conditions, of the battery charger 100 such as error alert tones or beeps indicating a change to a charging operation parameter.

Figure 6:
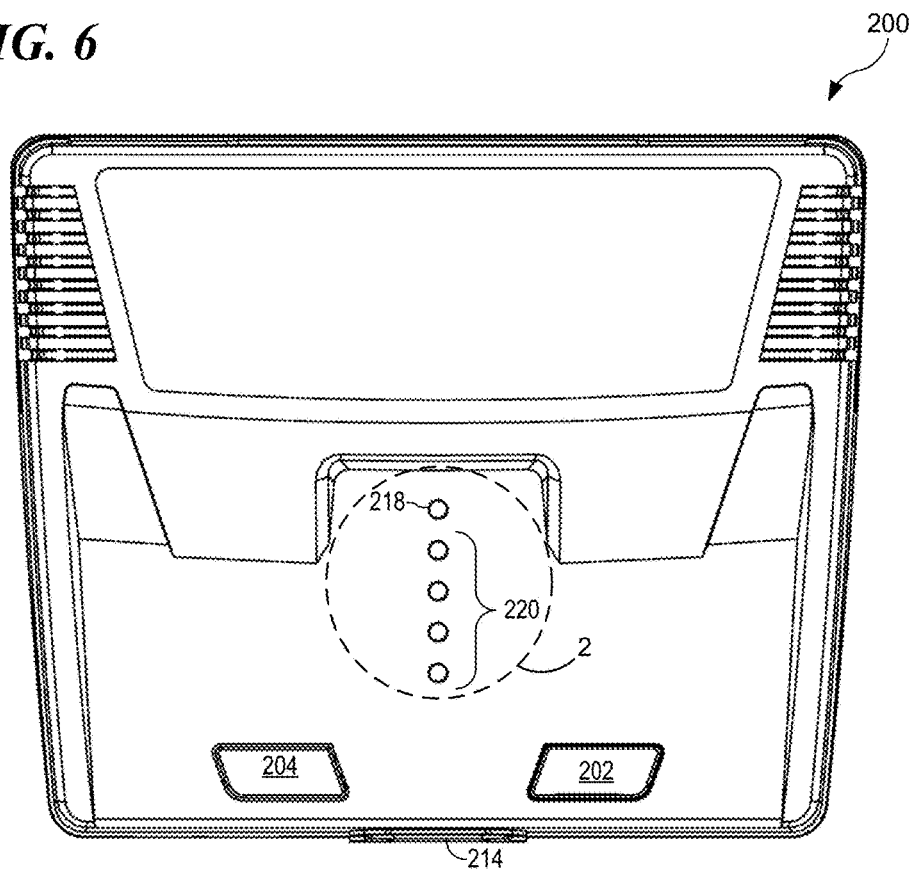
FIG. 6 is a top-down view of a second embodiment of a battery charger.
Figure 7:
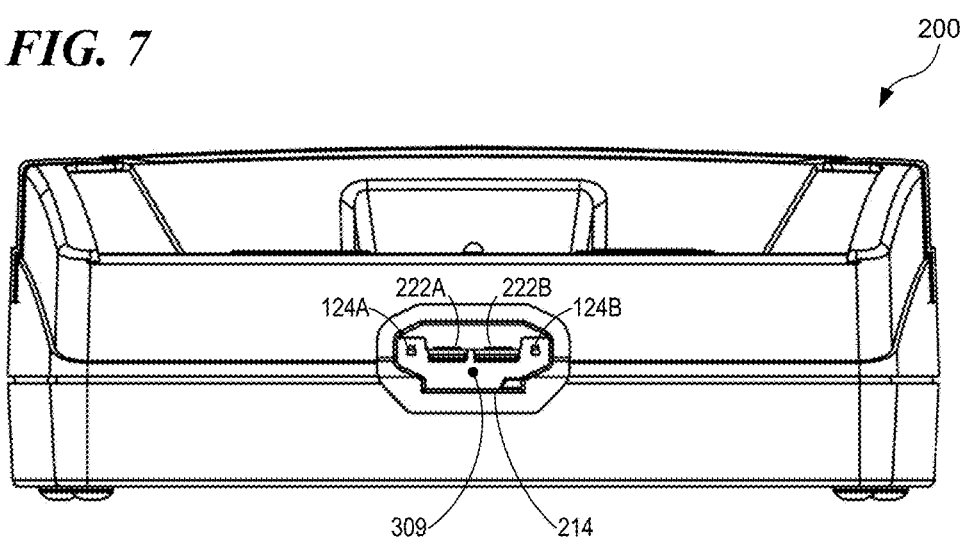
FIG. 7 is a front view of a battery charger according to the second embodiment of FIG. 6.
Figure 8:
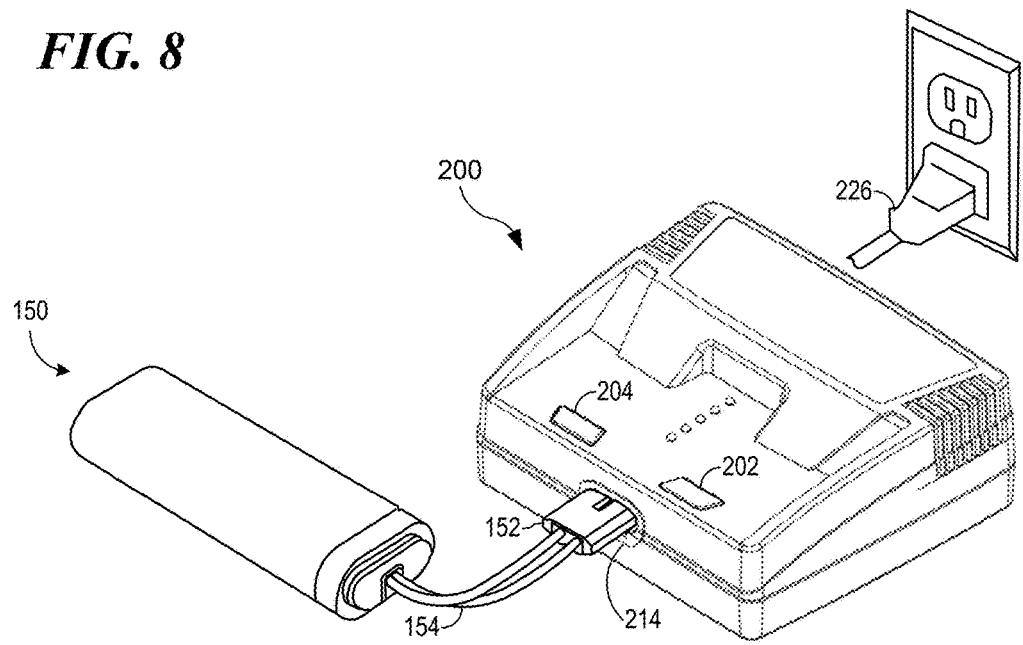
FIG. 8 is a perspective view of a battery charger according to the second embodiment of FIG. 6.

Referring now to FIGS. 6-8, a second embodiment of a battery charger is shown. The battery charger 200 may be configured to be compatible with batteries of a specific battery chemistry type. For example, the battery charger 200 may be configured to charge only NIMH type batteries. Accordingly, the battery charger 200 may be a "simplified" version of the battery charger 100 and may be implemented with fewer components than the battery charger 100.

The battery charger 200 may comprise a charger output port 214 for coupling the battery charger 200 to a rechargeable battery, a sensor device 309 for receiving information from the battery to be charged, two switches 202, 204 for receiving user input, a plurality of status indicators 218, 220, and a plug 226 for connecting the battery charger to a power supply.

As shown in FIG. 7, the battery charger 200 may comprise a charger output port 214 for electrically coupling a rechargeable battery to the battery charger 200. According to the embodiment shown, the charger output port 214 may comprise an electrical socket comprising an insulating material and implemented with two male terminals for receiving a female electrical connector (not labeled) of a rechargeable battery. The charger output port 214 may be further implemented with a sensor device 309, which may be an RFID reader, and which may be disposed along an inner surface of the electrical socket of charger output port 214. The battery charger 200 may be configured to provide a charging current to a rechargeable battery through the charger output port 214 upon user initiation of charging operation while the rechargeable battery is electrically connected to the charger output port 214.

According to embodiment shown in FIG. 1, the battery charger 200 may comprise two switches: a first switch 202 and a second switch 204. Both switches 202, 204 may receive user input to set one or more charging parameters of the battery charger 200 and/or initiate deliver of a charging current by the battery charger 200. As shown in FIG. 6, each switch may comprise a push button. In alternative embodiments, the switches may comprise any combination of push buttons, toggle switches, radial switches, and the like.

As shown in FIG. 6, the first switch 202 of the battery charger 200 may be a push-button switch providing the user "start/stop" control over the delivery of a charging current by the battery charger 200. The first switch 202 may also be configured to operate as a status indicator, illuminating to indicate a status or condition of the battery charger 200.

The first switch 202 of the battery charger 200 may have substantially similar construction and features as the corresponding first switch 102 of the battery charger 100, described above. Further, the first switch 202 of the battery charger 200 may perform substantially the same functions as the corresponding first switch 102 of the battery charger 100, described above. As such, specific features of the first switch 202 will not be described herein, but are instead, described through reference to the description of the first switch 102, above. The convention of describing the first switch 102 in this manner is adopted for the purpose of avoiding unnecessary and repetitive language, only, and shall not foreclose from the scope of this disclosure a wide range of variations, modifications, changes and substitutions expressly, or implicitly, disclosed here.

As shown in FIG. 6, the battery charger 200 may be implemented with a second switch 204 which may be a push button switch for allowing the user to select a "Charge Rate." The second switch 204 of the battery charger 200 may have substantially similar construction and features as the corresponding second switch 104 of the battery charger 100, described above. Further, the second switch 204 of the battery charger 200 may perform substantially the same functions as the corresponding second switch 104 of the battery charger 100, described above. As such, specific features of the second switch 204 will not be described herein, but are instead, described through reference to the description of the second switch 104, above. The convention of describing the second switch 204 in this manner is adopted for the purpose of avoiding unnecessary and repetitive language, only, and shall not foreclose from the scope of this disclosure a wide range of variations, modifications, changes and substitutions expressly, or implicitly, disclosed here.

As shown in FIG. 6, the battery charger 200 may be implemented with one or more indicators 218 and 220. The indicators 218 and 220, which may be one or more LEDs, may be configured to indicate the Charge Status, the selected Charge Rate, and the Charge Progress. In alternative embodiments, the indicators 218 and 220 may be configured to indicate additional, fewer, or different statuses of the battery charger.

Figure 9:
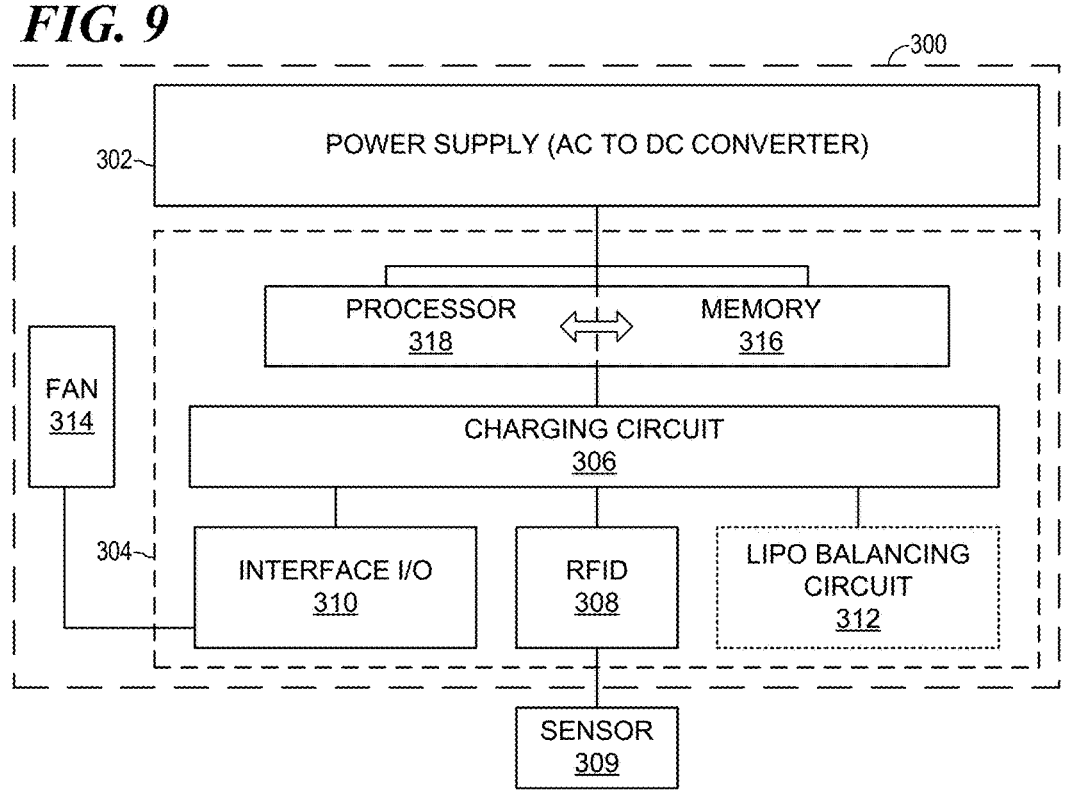
FIG. 9 is a block diagram of exemplary system components of a battery charger.

As shown in FIG. 6, the battery charger 200 may be implemented with a charger output port 214 for electrically coupling a rechargeable battery to the battery charger 200. In an embodiment, the charger output port 214 may be an electrical connector such as an electrical socket or receptacle for receiving an electrical plug coupled to a battery to be charged, for example. According to the embodiment shown, the charger output port 214 may comprise an electrical socket comprising an insulating material and implemented with two male terminals 222A and 222B for receiving a female electrical connector 152 of a rechargeable battery 150. In an embodiment, the charger output port 214 may be provided with balancing terminals 224A and 224B, which connect to LIPO Balancing Circuit 312, as shown in FIG. 9. The balancing terminals may not be utilized when charging other than LiPo batteries.

The indicators 218 and 220 of the battery charger 200 may have substantially similar construction and features as the corresponding indicators 118 and 120, respectively, of the battery charger 100, described above. Further, the indicators 218 and 220 of the battery charger 200 may perform substantially the same functions as the corresponding indicators 118 and 120, respectively, of the battery charger 100, described above. As such, specific features of the indicators 218 and 220 will not be described herein, but are instead, described through reference to the description of the indicators 118 and 120, respectively, above. The convention of describing the indicators 218 and 220 in this manner is adopted for the purpose of avoiding unnecessary and repetitive language, only, and shall not foreclose from the scope of this disclosure a wide range of variations, modifications, changes and substitutions expressly, or implicitly, disclosed here.

Referring now to FIG. 9, a block diagram of exemplary internal components of the battery charger 100 is shown. The battery charger 100 may comprise a controller 300, an RFID sensor 309, one or more balancing circuits 312, a charging circuit 306, power supply circuitry 302, and a fan 314.

As shown in FIG. 9, in an embodiment, the power supply circuit 302 may be an AC to DC converter circuit for converting AC current received by the battery charger 100 to DC current. The power supply circuit 302 may comprise any known components or methods for power conversion comprising the prior art that may be suitable for use in a battery charger having the capabilities described in reference to the battery charger 100, herein.

As shown in FIG. 9, in an embodiment, the charging circuit 306 may be operably connected to the power supply circuit 302 and may be configured to provide a charge current for charging a battery in accordance with desired charging parameter settings. The charging circuit 306 may comprise any known components or methods for configuring the DC current received from the power supply circuit 302 comprising the prior art that may be suitable for use in a battery charger having the capabilities described in reference to the battery charger 100, herein. The charging circuit 306 may be capable of configuring a charge current suitable for charging batteries of the type and size described herein and in accordance with known charging methods, such as: peak voltage detection charging; constant voltage constant current charging; trickle charging; balance charging; storage charging; and the like.

The controls components 300 may include an RFID reader 308 for establishing RF communication with batteries implemented with an RFID tag, to receive data from the battery for use in configuring the charge current provided by the battery charger 100. The RFID reader 308 may be operably connected to a processor 318 and/or an interface I/O 310 and may communicated data received from a battery implemented with an RFID tag to those components. The RFID reader 308 may be of the type and have the functional capabilities as described in U.S. Provisional Patent Application, Ser. No. 62/007,403 filed on Jun. 3, 2014, titled "Intelligent Battery-Powered System Connector.

The interface I/O 310 may receive and route data from and between the components comprising the controls components 300 of the battery charger 300. The interface I/O may operably connect to any other components comprising the controls components 300 through any operable connection methods comprising the prior art for sending and/or receiving signals, physical communications, and/or logical communications. In a particular embodiment, the interface I/O 310 may be configured to receive data from the RFID reader 308 and direct the received data to other components, such as the processor 318, the charging circuit 306, a LiPo balancing circuit 312, or the like. In an alternative embodiment, the controls components 300 may not include an interface I/O 310. In such embodiments, the components comprising the controls components 300 may be configured to communicate directly through wired or wireless connections between the components.

As shown in FIG. 9, the controls components 300 may include one or more LiPo balancing circuit 312 for providing low amperage balance charge currents for use in charging LiPo type batteries. The LiPo balancing circuits 312 may operably connect to other components such as the RFID reader 308, the interface I/O 310, the charging circuit 306, the power supply circuit 302, the memory 316, and/or the processor 318. The LiPo balancing circuits 312 may comprise any known components or methods for balance charging a LiPo battery comprising the prior art that may be suitable for use in a battery charger having the capabilities and features described in reference to the battery charger 100, herein. The LiPo balancing circuits 312 may be capable of configuring a balance charge current suitable for charging batteries of the type and size described herein and in accordance with known charging methods, such as: peak voltage detection charging; constant voltage constant current charging; trickle charging; balance charging; storage charging; and the like.

As shown in FIG. 9, in an embodiment, the controls components 300 may include a fan 314 that may circulate air within the battery charger 100 to cool the controls components 300 during battery charger 100 operation. The fan 314 may comprise any fan of any type or size comprising the prior art that may be suitable for use in a battery charger having the capabilities described in reference to the battery charger 100, herein.

The controls components 300 may be implemented with a memory 316 for storing code, operational logic, instructions, predefined settings, or other data which may be used for operation and control of the battery charger 100. In an embodiment, the memory 316 may store a listing of battery identifiers for matching to an identifier that may be stored on an RFID tag of a battery to be charged. The memory 316 may be a volatile memory or a non-volatile memory of any type comprising the prior art. The memory 316 may include an optical, magnetic (hard drive) or any other form of data storage device. In one embodiment, the memory 316 may be built into the processor 318.

The memory 316 may store computer executable instructions. The processor 318 may execute computer executable instructions. The computer executable instructions may be included in computer code. The computer code may be stored in the memory 316. The computer code may be written in any computer language comprising the prior art. The memory 316 may be a non-transitory tangible storage media.

The computer code may be logic encoded in one or more tangible media or one or more non-transitory tangible media for execution by the processor 318. Logic encoded in one or more tangible media for execution may be defined as instructions that are executable by the processor 318 and that are provided on the computer-readable storage media, memories, or a combination thereof. Logic may include a software controlled microprocessor, an application specific integrated circuit (ASIC), an analog circuit, a digital circuit, a programmed logic device, a memory device containing instructions, and the like. The instructions may be stored on any computer readable medium comprising the prior art from which a computer, a processor, or other electronic device can read.

The processor 318 may include a general processor, digital signal processor, ASIC, field programmable gate array, analog circuit, digital circuit, central processing unit (CPU), micro-processor unit (MPU), micro-controller unit (MCU), combinations thereof, or other now known processor. The processor 318 may be a single device or combinations of devices, such as associated with a network or distributed processing. The processor 318 may be responsive to or operable to execute instructions stored as part of software, hardware, integrated circuits, firmware, microcode or the like. The functions, acts, methods or tasks illustrated in the figures or described herein may be performed by the processor 318 executing instructions stored in the memory 316.

The memory 316 may store a predefined set of instructions that may be used by the processor 318 to control the operation of the battery charger 100. The processor may receive input from the user of the battery charger 100, from the battery to be charged through an RF connection with the battery, or from both sources. The processor may respond to input received from the user, or from the battery, or both, to configure the charge current of the battery charger 100, to initiate or terminate charging operation, initiate or change an indicator communicating an operational status or parameter of the battery charger 100, or some other similar response.

Figure 10:
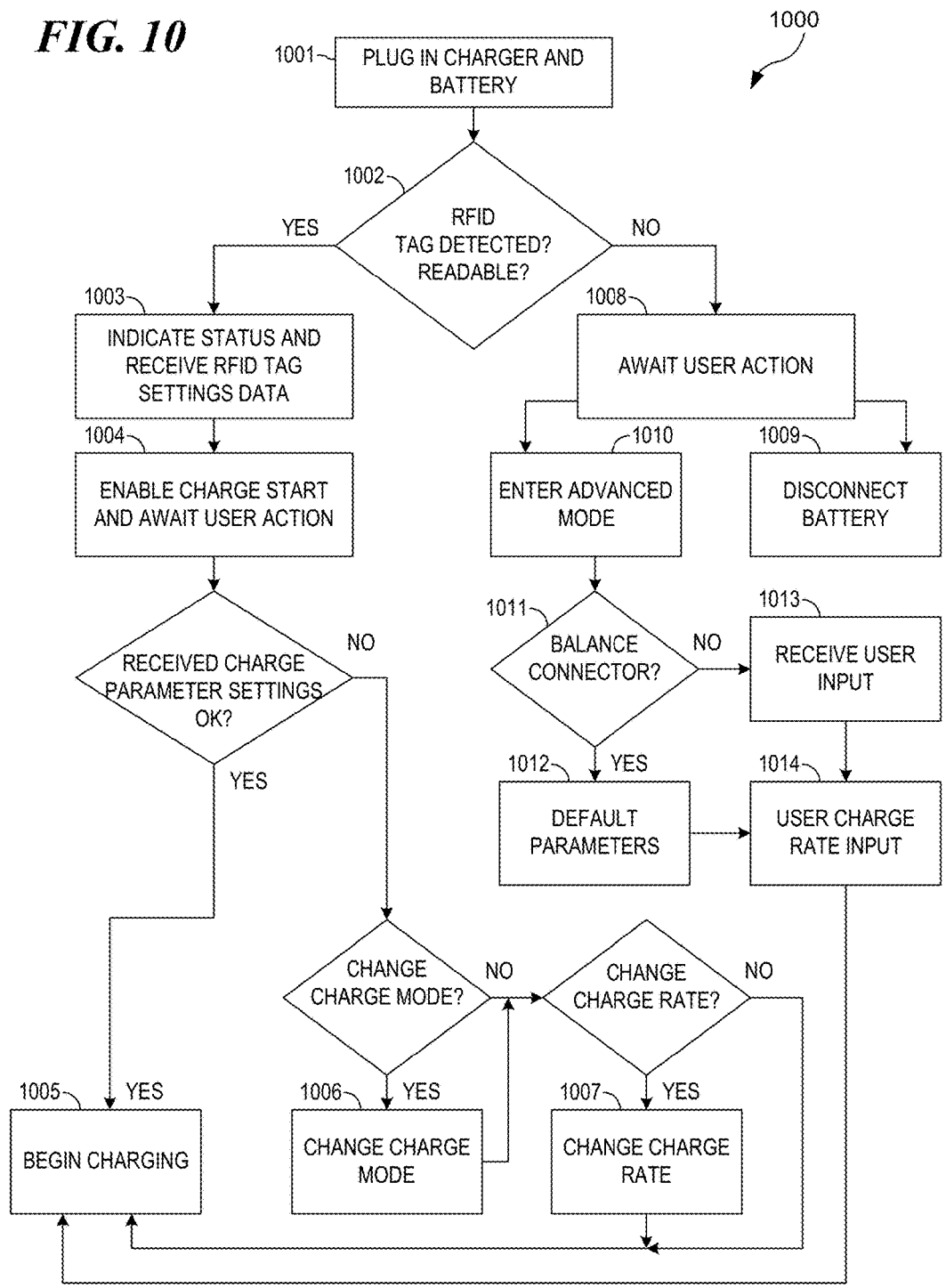
FIG. 10 is a flowchart showing system operation of a battery charger.

Turning now to FIG. 10, a method 1000 illustrating operational steps of an embodiment of the battery charger 100 is shown. At Step 1001, the user may plug in the battery charger 100 to a power source. The battery charger 100 may indicate that power is being received and that a battery may be connected by illuminating the Charge Rate/Progress indicators 120 in a "runway" pattern, followed by slow flashing of the Charge Status indicator 118. The user may connect the battery to be charged to the charger output port 114. Additionally, the user may connect a balance port connector of the battery to be charged to the appropriately sized balance port 116 of battery charger 100 if the battery to be charged is a LiPo type battery and is not implemented with an RFID tag.

At Step 1002, the battery charger 100 may determine if the battery connected to the charger output port 114 is implemented with a readable RFID tag. If the battery inserted is implemented with an RFID tag that is readable by the sensor device 309 of the battery charger 100, the battery charger 100 may indicate to the user that a "smart" battery has been detected by illuminating the first switch 102, which may be the "Start/Stop" labeled push button, at Step 1003. Also at Step 1003, the battery charger 100 may receive information from the RFID tag of the battery to be charged and configure the charging parameters of the battery charger 100 in accordance with the information received from the battery to be charged and from default settings of the battery charger 100. Illumination of the "Start/Stop" button may indicate to the user that the battery charger 100 is ready to begin supplying a charge current to the battery and will do so upon the user pressing and holding the "Start/Stop" button for 2 seconds.

At Step 1004, the battery charger may wait for user action. If the battery charger 100 charging parameters are acceptable as configured, the user may begin charging operation by the battery charger 100 by pressing and holding the "Start/Stop" button for 2 seconds at Step 1005.

If desired, the user may change the Charge Mode of the battery charger 100 at Step 1006, by pressing the "Charge Mode" push button, switch 112, to toggle between available modes. During user selection of a Charge Mode at Step 1006, the battery charger 100 may remain ready to begin supplying a charge current to the battery to be charged. The user may begin charging operation by the battery charger 100 at any time by pressing and holding the "Start/Stop" button for 2 seconds.

Additionally, if desired, the user may change the Charge Rate of the battery charger 100 at Step 1007, by simultaneously pressing and holding the "Start/Stop" and the "Charge Rate" push buttons, switches 102 and 104, respectively, for 2 seconds. This may place the battery charger 100 in "Advanced Mode." The Charge Rate/Progress indicator 120 corresponding to the currently selected Charge Rate may begin flashing to indicate to the user that the battery charger is awaiting a Charge Rate selection by the user. The user may then change the Charge Rate to a desired setting by pressing the "Charge Rate" push button, the second switch 104, to toggle between available Charge Rates. During user selection of a Charge Rate at Step 1007, the battery charger

100 may remain ready to begin supplying a charge current to the battery to be charged. The user may begin charging operation by the battery charger 100 at any time by pressing and holding the "Start/Stop" button for 2 seconds.

Although the method 1000, as shown in FIG. 10, orders the Charge Mode change step, Step 1006, before the Charge Rate change step, Step 1007, it should be noted that these steps may be performed in any order, relative to one another. For example, a user may elect to change the Charge Rate, first, before changing the Charge Mode.

Returning to Step 1002, if the battery charger 100 determines that the connected battery is not implemented with an RFID tag, or is implemented with an unreadable RFID tag, the battery charger 100 may indicate this status to the user at Step 1008. At Step 1008, the battery charger 100 may illuminate the Charging Rate/Status indicators 120 in a sweeping manner. Additionally, the "Start/Stop" push button may not illuminate. The battery charger may be configured to remain in this state and await action by the user.

The user may elect to disconnect and reconnect the battery, at Step 1009, returning to Step 1001. The user may elect to take this action in instances where the battery connected is implemented with an RFID tag but an RFID connection was not made with the battery charger 100 during coupling of the battery and the battery charger 100.

Alternatively, the user may elect to enter "Advanced Mode" at Step 1010, by simultaneously pressing and holding the "Start/Stop" and the "Charge Rate" push buttons, switches 102 and 104, respectively, for 2 seconds. The user may elect this action when the battery to be charged is not implemented with an RFID tag.

The battery charger 100 may determine whether a balance port connector has been electrically coupled to a balance port 116 at Step 1011. If a balance connector is detected, the battery charger 100 may select default charging parameter settings, such as setting the Battery Type to "LiPo" and setting the Charge Mode to "Balance" at Step 1012.

If no balance connector is detected, the battery charger 100 may prompt the user to select a Battery Type by illuminating the Battery Type selection indicators 110 in an alternating manner at Step 1013. The user may select a Battery Type by pressing the "Battery Type" push button, the switch 108, until the Battery Type selection indicator 110 corresponding to the desired Battery Type is illuminated. The battery charger 100 may select a default Charge Mode based on the Battery Type selected. For example, Balance mode may be selected for LiPo batteries and Fast mode selected for NiMH batteries. Additionally, the battery charger 100 may be configured to indicate a Battery Type mismatch error if the user selects the "LiPo" Battery Type and the battery charger 100 does not detect a balance connector coupled to a balance connector port 116, at Step 1013.

At Step 1014, the battery charger 100 may prompt the user to select a Charge Rate by illuminating the Charge Rate/Progress indicator 120A in a flashing mode. The user may select a Charge Rate by pressing the "Charge Rate" push button, the switch 104, to toggle between available Charge Rates until the Charge Rate/Progress indicator 120 corresponding to the desired Charge Rate is illuminated. Once the user selects a Charge Rate, the battery charger 100 may be configured to begin supplying a charge current to the battery to be charged. The user may begin charging operation by the battery charger 100 by pressing and holding the "Start/Stop" button for 2 seconds.

Once charging commences, regardless of the Battery Type, Charge Mode, or Charge Rate selections, the Charge Status indicator 118 may be configured to continuously "blink," indicating that a charging is in progress. The Charge Rate/Progress indicators 120 may also illuminate to display the amount of charge contained by the battery relative to the peak charge of the battery. The battery charger 100 may continuously monitor for undue delay in peak charge detection or over-temperature conditions using thermocouples, infrared radiation, and other methods.

The charge process may be halted by the occurrence of a peak charge detection timeout, or an over-temperature condition. Additionally, the charging may be halted by the user pressing the "Start/Stop" button or disconnecting the battery. If the "Start/Stop" button is pressed the battery charger 100 may revert to its pre-charging configuration, with indicators illuminated to show current parameter setting selections. If the battery is disconnected during charging, the battery charger 100 may be configured to illuminate the Charge Rate/Progress indicators in the "runway" pattern, indicating that the battery charger 100 is awaiting coupling of a battery to the charge output port 114.

Alternatively, if the charging process is not interrupted, and reaches completion, the Charge Status indicator 118 may be configured to cease blinking and illuminate solidly. Further, the Charge Rate/Progress indicators 120 may turn off. The battery charger 100 may automatically begin "trickle charging" the battery for up to a pre-set amount of time while waiting for the user to disconnect the battery.

An embodiment of the battery charger 200, as described above, may be implemented with a method of operation similar to that shown in FIG. 10 and described in reference to the battery charger 100, with the steps associated to LiPo battery charging omitted.

Having described the features and capabilities of several embodiments of a battery charger according to the present invention, along with a method of operation for the battery charger, several illustrative examples of battery charger use are now provided.

Figure 11:
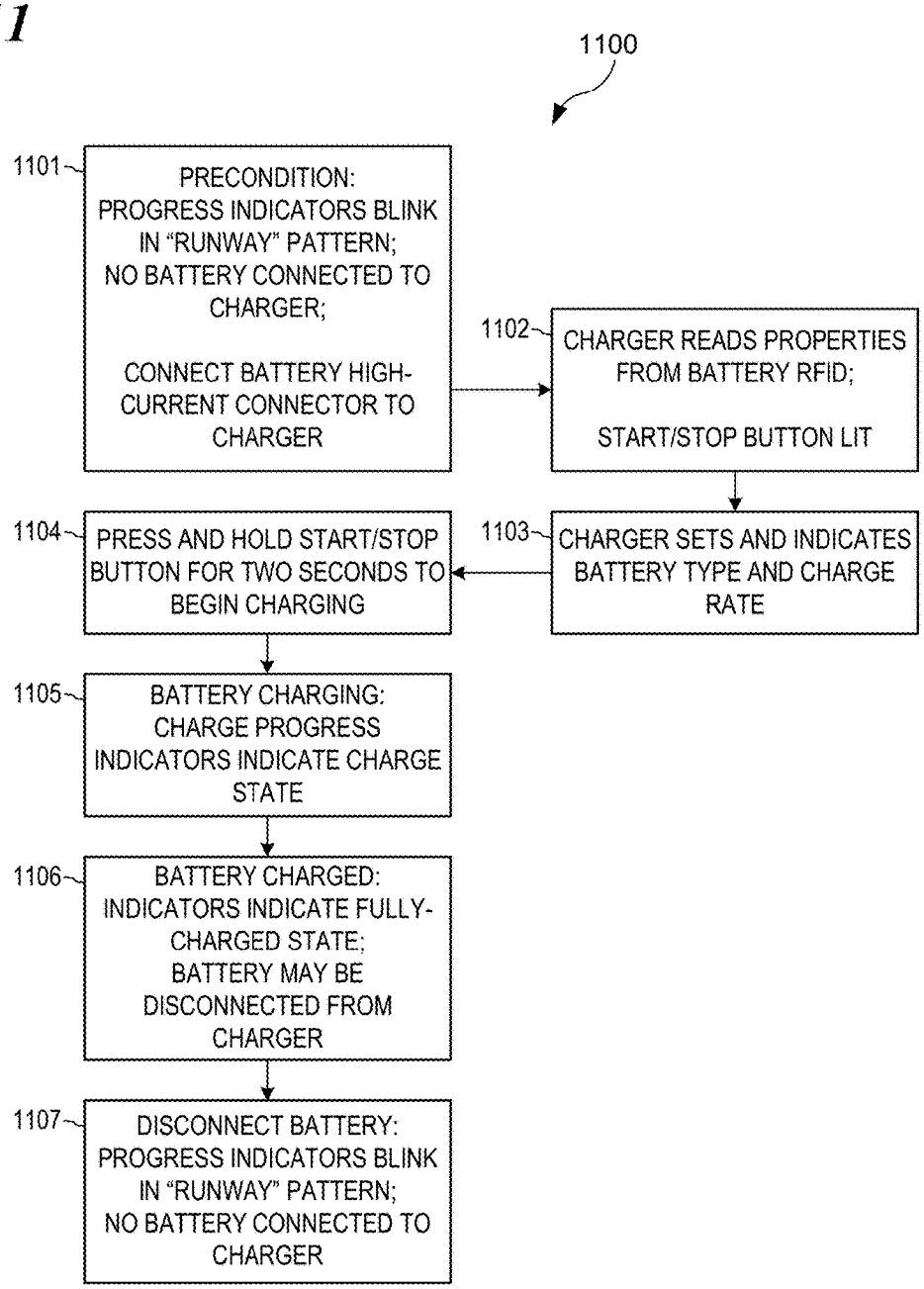
FIG. 11 is a flowchart illustrating a mode of operation of a battery charger.

The battery charger 100 may be used in accordance with method 1000 to balance charge a "smart" LiPo type battery implemented with an RFID chip using the RFID defined and default settings, as shown in FIG. 11. At Step 1101, the battery charger may be electrically coupled to a power supply and the "smart" LiPo battery may be connected to the charge output port. The battery charger may then detect the RFID tag and respond by illuminating the "Start/Stop" button at Step 1102. The battery charger may then receive information from the battery RFID tag and may set the battery charger operating parameters to the "LiPo," "Balance," and "4 A" settings at Step 1103. The user may then commence charging by pressing and holding the "Start/Stop" button for 2 seconds at Step 1104.

At Step 1105, battery charging commences and the Charge Status indicator 118 "blinks." The Charge Rate/Progress indicators 120 also illuminate to display the amount of charge contained by the battery relative to the peak charge of the battery.

At Step 1106, the charging process completes, the Charge Status indicator 118 may be configured to cease blinking and illuminate solidly. Further, the Charge Rate/Progress indicators 120 may turn off. The battery charger 100 may automatically begin "trickle charging" the battery for up to a pre-set amount of time while waiting for the user to disconnect the battery. Once the battery is disconnected, at Step 1107, the battery charger 100 may illuminate the Charge Rate/Progress indicators in the "runway" pattern, indicating that the battery charger 100 is awaiting coupling of a battery to the charge output port 114.

Figure 12:
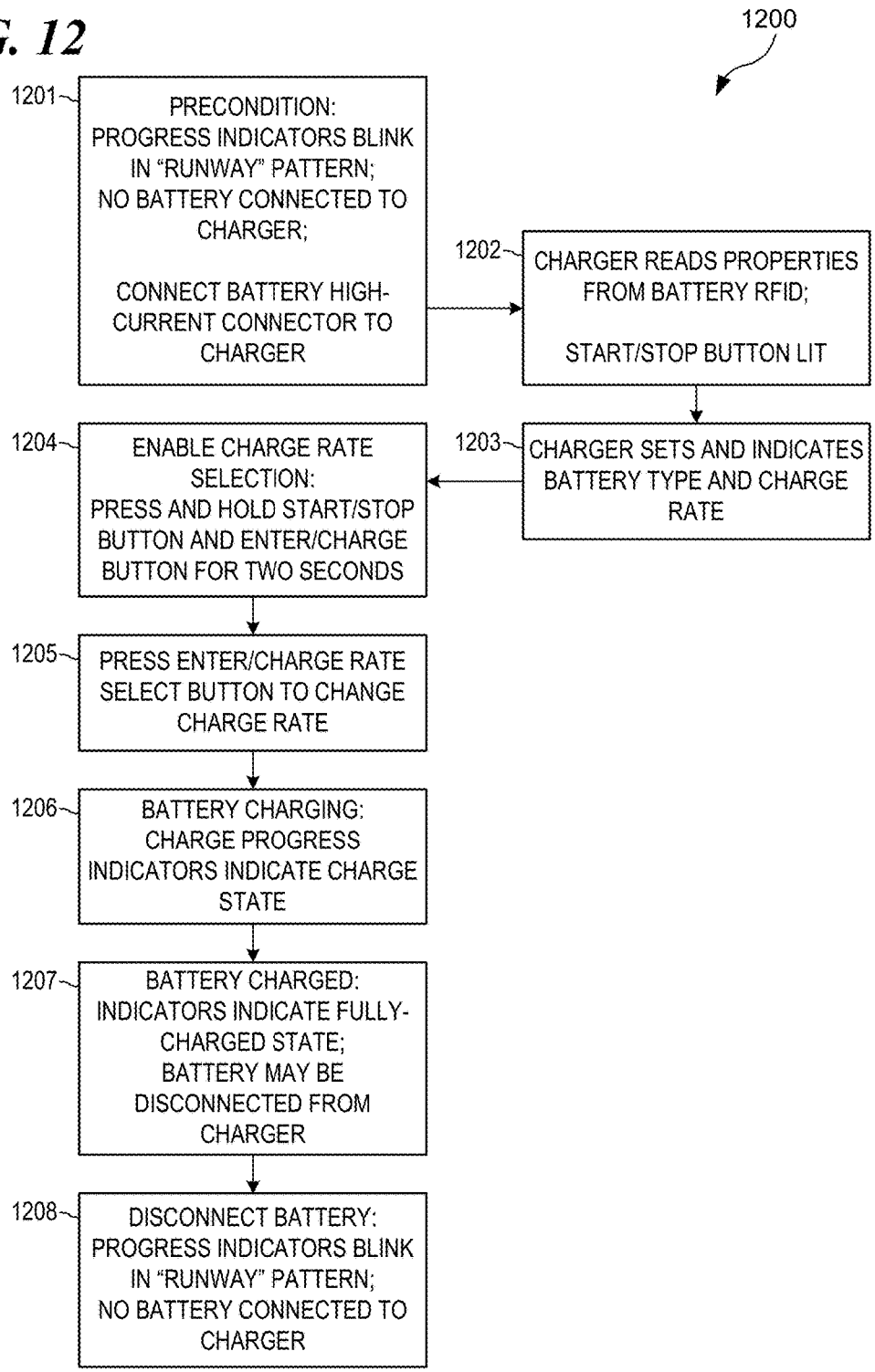
FIG. 12 is a flowchart illustrating a mode of operation of a battery charger.

The battery charger 100 may be used in accordance with method 1000 to balance charge a "smart" LiPo battery implemented with an RFID chip and using "Advanced Mode" to select the "2 A" Charge Rate, as shown in FIG. 12. At Step 1201, the battery charger may be electrically coupled to a power supply and the "smart" LiPo battery may be connected to the charge output port. The battery charger may then detect the RFID tag and respond by illuminating the "Start/Stop" button at Step 1202. The battery charger may then receive information from the battery RFID tag and may set the battery charger operating parameters to the "LiPo," "Balance," and "4 A" settings at Step 1203.

At Step 1204, the user may change the Charge Rate of the battery charger 100 using "Advanced Mode" by simultaneously pressing and holding the "Start/Stop" and the "Charge Rate" push buttons for 2 seconds. The Charge Rate/Progress indicator 120 corresponding to the currently selected Charge Rate may begin flashing to indicate to the user that the battery charger is awaiting a Charge Rate selection by the user.

At Step 1205, the user may change the Charge Rate to a desired setting of "2 A" by pressing the "Charge Rate" push button twice. During user selection of a Charge Rate at Step 1205, the battery charger 100 may remain ready to begin supplying a charge current to the battery to be charged. The user may begin charging operation at Step 1206 by pressing and holding the "Start/Stop" button for 2 seconds.

At Step 1206, battery charging commences and the Charge Status indicator 118 "blinks." The Charge Rate/Progress indicators 120 also illuminate to display the amount of charge contained by the battery relative to the peak charge of the battery. At Step 1207, the charging process completes, the Charge Status indicator 118 may be configured to cease blinking and illuminate solidly. Further, the Charge Rate/Progress indicators 120 may turn off. The battery charger 100 may automatically begin "trickle charging" the battery for up to a pre-set amount of time while waiting for the user to disconnect the battery.

Once the battery is disconnected, at Step 1208, the battery charger 100 may illuminate the Charge Rate/Progress indicators in the "runway" pattern, indicating that the battery charger 100 is awaiting coupling of a battery to the charge output port 114.

Figure 13:
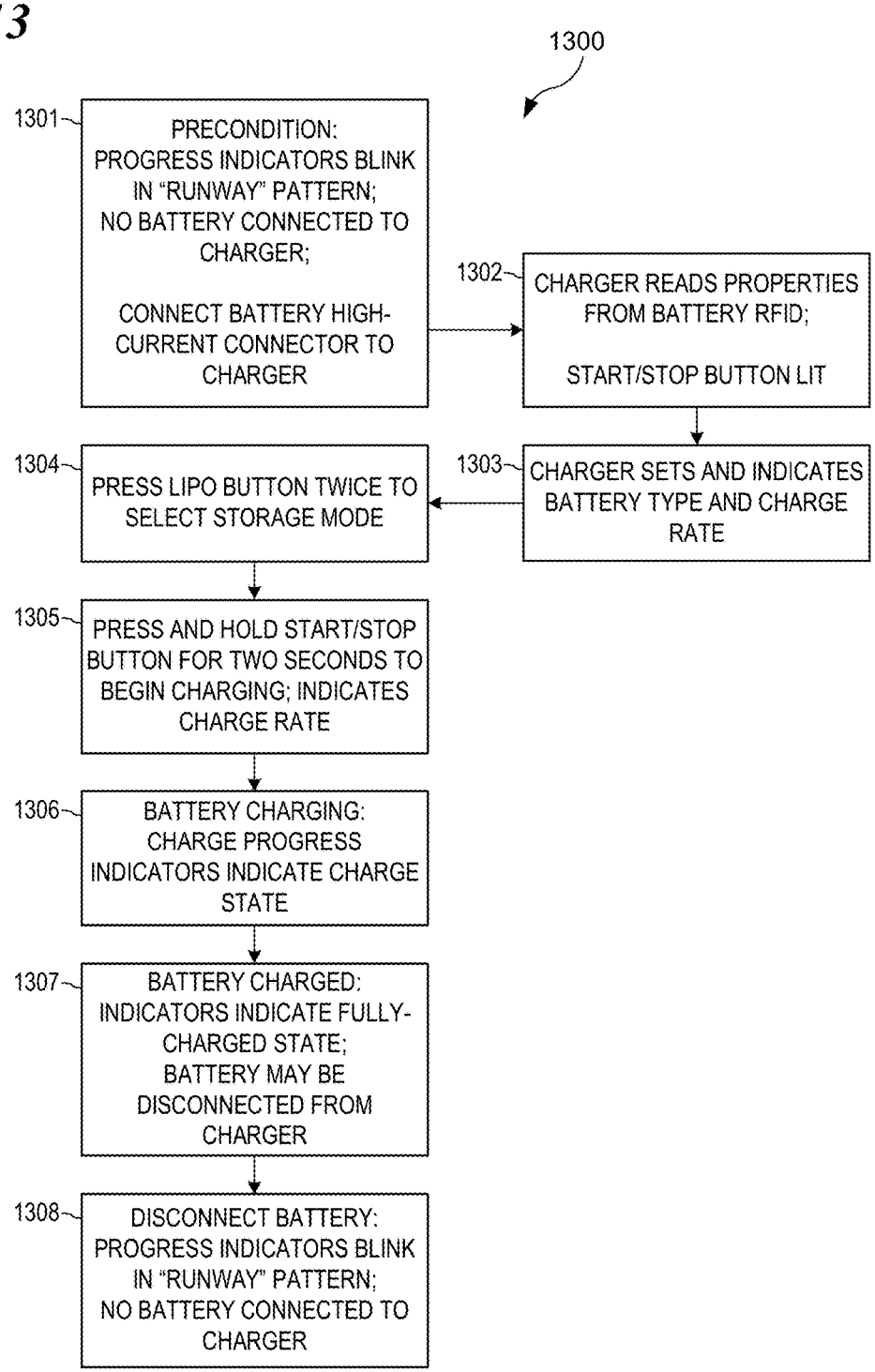
FIG. 13 is a flowchart illustrating a mode of operation of a battery charger.

The battery charger 100 may be used in accordance with method 1000 to charge a "smart" LiPo battery implemented with an RFID chip for storage, as shown in FIG. 13. At Step 1301, the battery charger may be electrically coupled to a power supply and the "smart" LiPo battery may be connected to the charge output port. The battery charger may then detect the RFID tag and respond by illuminating the "Start/Stop" button at Step 1302. The battery charger may then receive information from the battery RFID tag and may set the battery charger operating parameters to the "LiPo," "Balance," and "4 A" settings at Step 1303.

At Step 1304, the user may change the Charge Mode of the battery charger 100 by pressing the "Charge Mode," or "LIPO" push button until "Storage" mode is selected. During user selection of a Charge Mode at Step 1304, the battery charger 100 may remain ready to begin supplying a charge current to the battery to be charged. The user may begin charging operation by pressing and holding the "Start/Stop" button for 2 seconds at step 1305.

At Step 1306, battery charging commences and the Charge Status indicator 118 "blinks." The Charge Rate/Progress indicators 120 also illuminate to display the amount of charge contained by the battery relative to the peak charge of the battery. At Step 1307, the charging process completes, the Charge Status indicator 118 may be configured to cease blinking and illuminate solidly. Further, the Charge Rate/Progress indicators 120 may turn off.

Once the battery is disconnected, at Step 1308, the battery charger 100 may illuminate the Charge Rate/Progress indicators in the "runway" pattern, indicating that the battery charger 100 is awaiting coupling of a battery to the charge output port 114.

Figure 14:
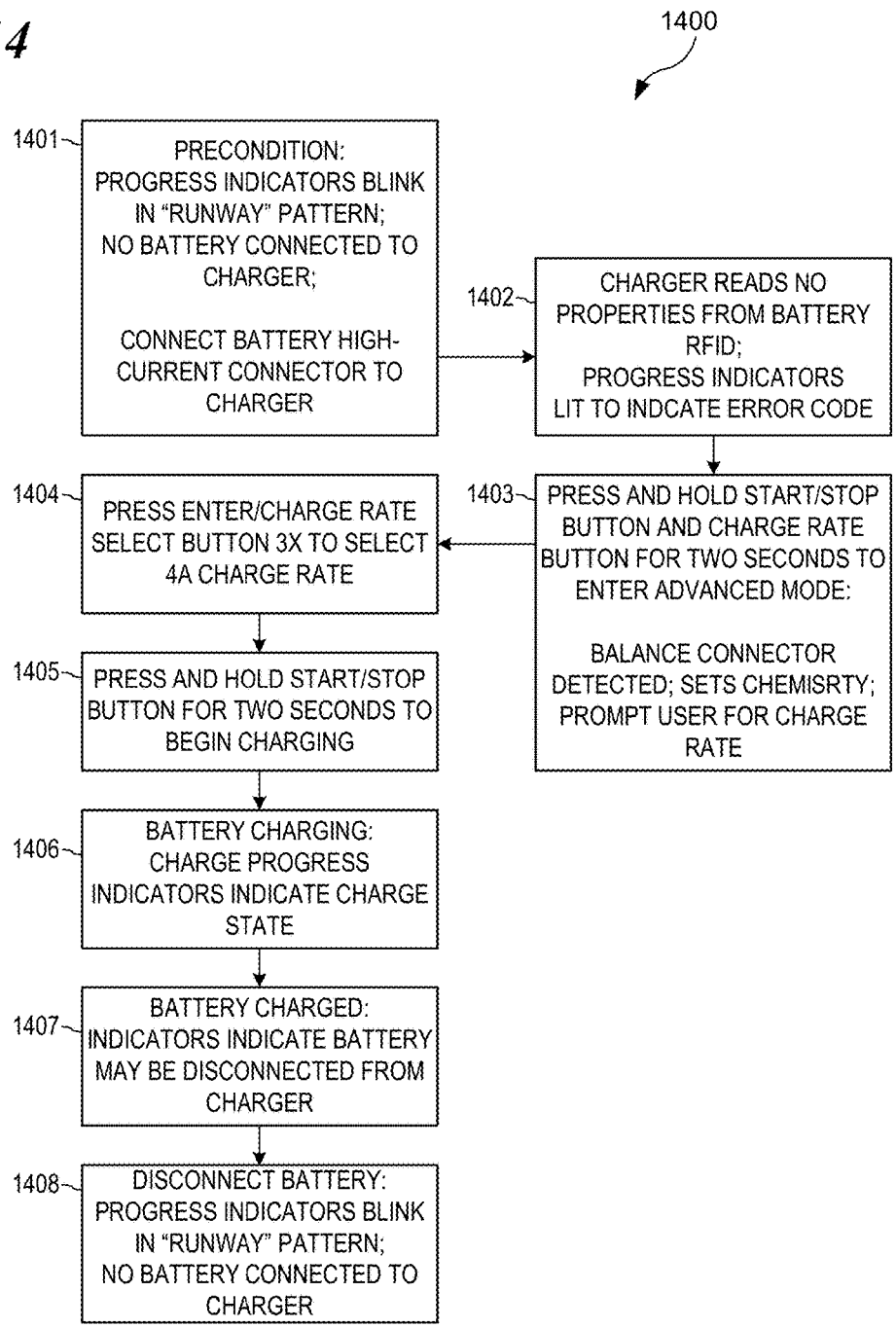
FIG. 14 is a flowchart illustrating a mode of operation of a battery charger.

The battery charger 100 may be used in accordance with method 1000 to balance charge a LiPo battery without an RFID chip, as shown in FIG. 14. At Step 1401, the battery charger may be electrically coupled to a power supply and the LiPo battery may be connected to the charge output port. Additionally, a balance connector may be connected to a balance port of the battery charger at Step 1401.

At Step 1402, the battery charger may detect that the battery is not implemented with an RFID tag and respond by illuminating the Charging Rate/Status indicators in a sweeping manner. The battery charger may remain in this state and await action by the user. At Step 1403, the user may elect to enter "Advanced Mode" by simultaneously pressing and holding the "Start/Stop" and the "Charge Rate" push buttons for 2 seconds.

At Step 1403, the battery charger may detect the balance connector electrically coupled to a balance port and may set the charging parameter settings to "LiPo" and "Balance." The "1 A" Charge Rate/Progress indicator may begin flashing to indicate to the user that the battery charger is awaiting a Charge Rate selection by the user.

At Step 1404, the user may change the Charge Rate to a desired setting of "4 A" by pressing the "Charge Rate" push button three times. Upon user selection of a Charge Rate at Step 1404, the battery charger 100 may become ready to begin supplying a charge current to the battery to be charged. The user may begin charging operation at Step 1405 by pressing and holding the "Start/Stop" button for 2 seconds.

At Step 1406, battery charging commences and the Charge Status indicator 118 "blinks." The Charge Rate/Progress indicators 120 also illuminate to display the amount of charge contained by the battery relative to the peak charge of the battery. At Step 1407, the charging process completes, the Charge Status indicator 118 may be configured to cease blinking and illuminate solidly. Further, the Charge Rate/Progress indicators 120 may turn off. The battery charger 100 may automatically begin "trickle charging" the battery for up to a pre-set amount of time while waiting for the user to disconnect the battery.

Once the battery is disconnected, at Step 1408, the battery charger 100 may illuminate the Charge Rate/Progress indicators in the "runway" pattern, indicating that the battery charger 100 is awaiting coupling of a battery to the charge output port 114.

Figure 15:
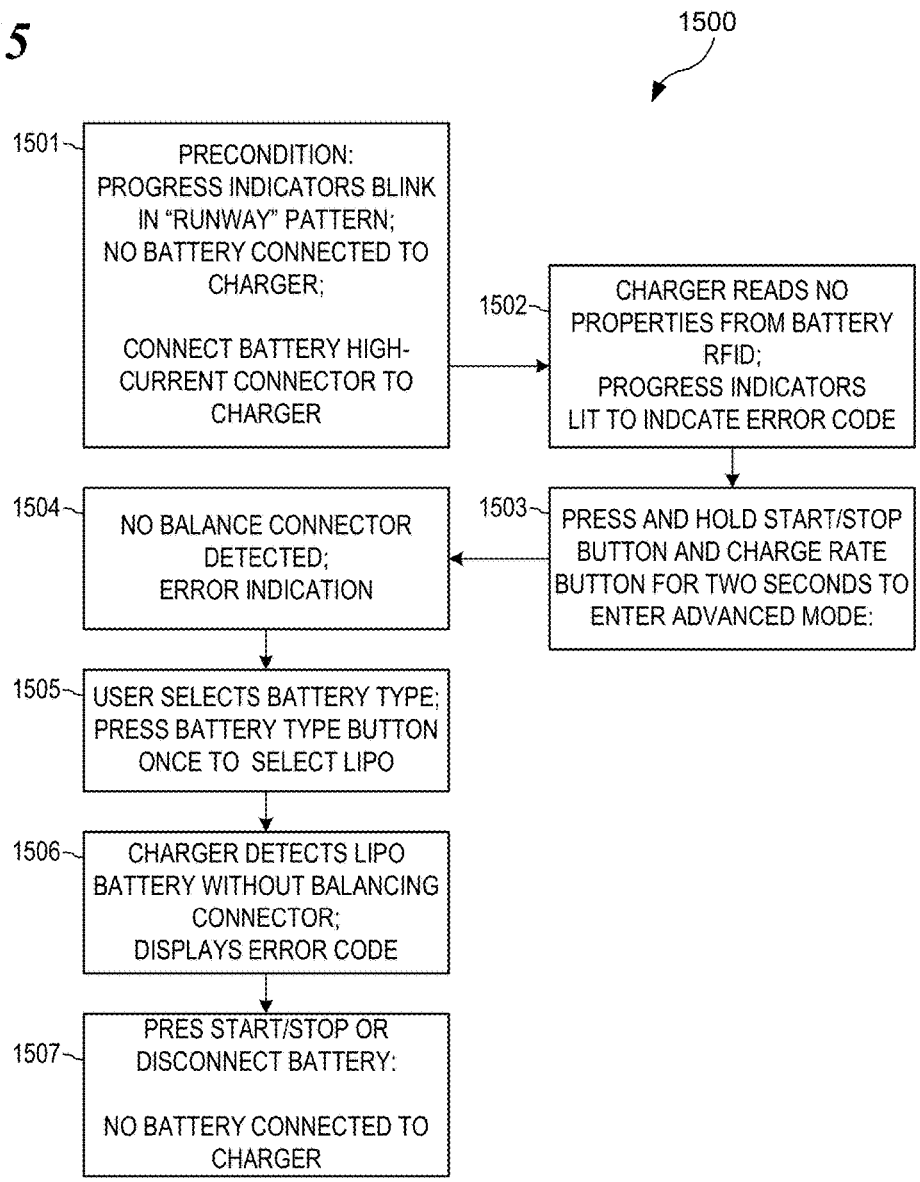
FIG. 15 is a flowchart illustrating a mode of operation of a battery charger.

FIG. 15 illustrates how the battery charger may deter the user from charging a LiPo battery not implemented with an RFID tag without a balance connector coupled to a balance connector port. At Step 1501, the battery charger may be electrically coupled to a power supply and the LiPo battery may be connected to the charge output port.

At Step 1502, the battery charger may detect that the battery is not implemented with an RFID tag and respond by illuminating the Charging Rate/Status indicators in a sweeping manner. The battery charger may remain in this state and await action by the user. At Step 1503, the user may elect to enter "Advanced Mode" by simultaneously pressing and holding the "Start/Stop" and the "Charge Rate" push buttons for 2 seconds.

At Step 1504, the battery charger may detect that no balance connector is electrically coupled to a balance port and prompt the user to select a Battery Type by illuminating the LiPo and NIMH battery type selection indicators in an alternating manner. The user may select the "LiPo" Battery Type by pressing the "Battery Type" push button once at Step 1505. The battery charger may illuminate the "LiPo" Battery Type selection indicator in a solid mode and illuminate the Charge Mode selection indicator corresponding to "Balance."

At Step 1506, the battery charger may detect that "LiPo" is selected while no balance connector is coupled to a balance connector port of the battery charger. The battery charger may indicate the error condition by illuminating the "1 A" Charge Rate/Progress indicator in a blinking manner. The "1 A" Charge Rate/Progress indicator may continue to blink until the user either disconnects the battery or presses the "Start/Stop" button.

Figure 16:
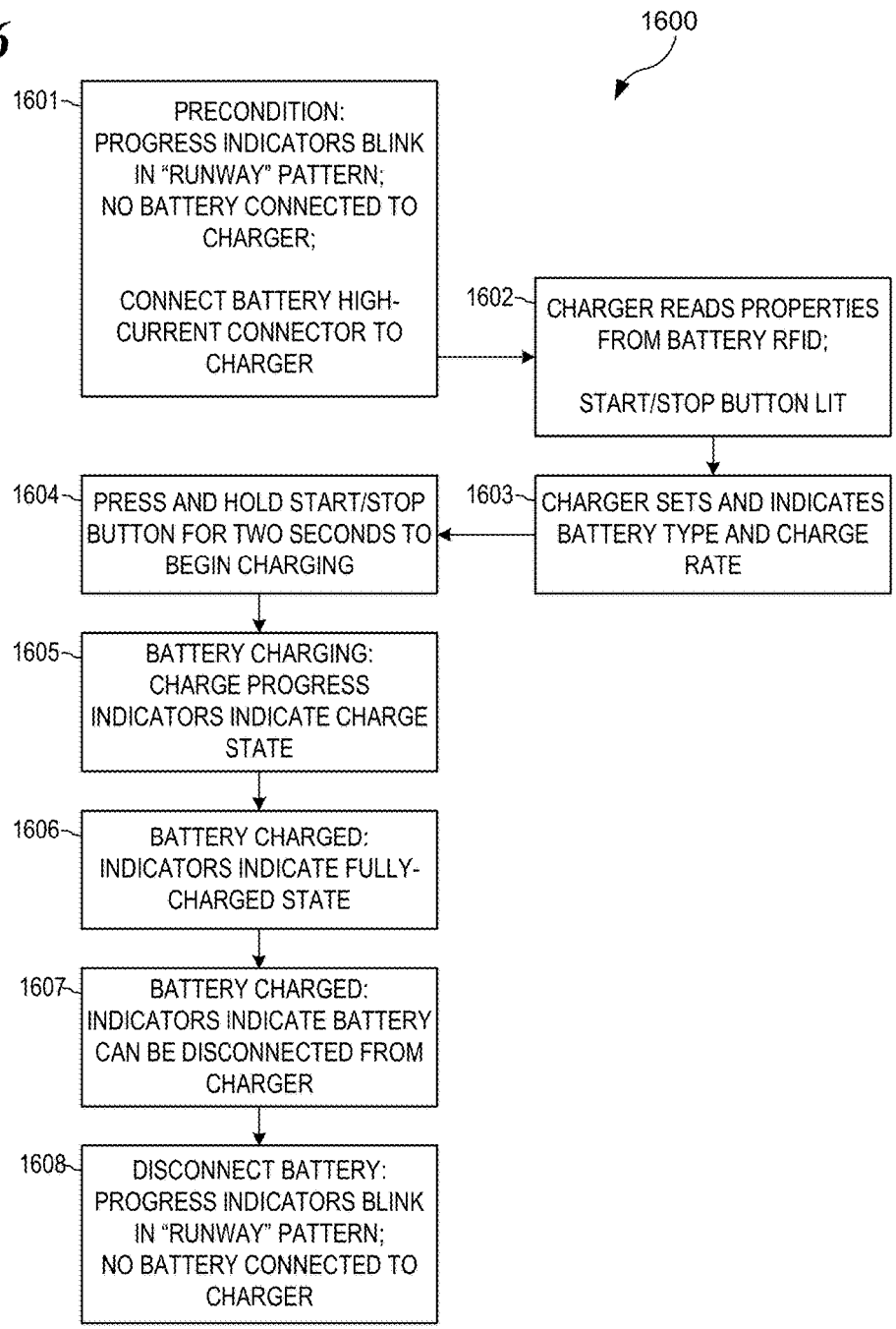
FIG. 16 is a flowchart illustrating a mode of operation of a battery charger.

The battery charger 100 may be used in accordance with method 1000 to fully charge a "smart" NiMH type battery implemented with an RFID chip using the RFID defined and default settings, as shown in FIG. 16. At Step 1601, the battery charger may be electrically coupled to a power supply and the "smart" NiMH battery may be connected to the charge output port. The battery charger may then detect the RFID tag and respond by illuminating the "Start/Stop" button at Step 1602. The battery charger may then receive information from the battery RFID tag and may set the battery charger operating parameters to the "NiMH" and "4 A" settings at Step 1603. The user may then commence charging by pressing and holding the "Start/Stop" button for 2 seconds at Step 1604.

At Step 1605, battery charging commences and the Charge Status indicator 118 "blinks." The Charge Rate/Progress indicators 120 also illuminate to display the amount of charge contained by the battery relative to the peak charge of the battery.

At Step 1606, the charging process completes, the Charge Status indicator 118 may be configured to cease blinking and illuminate solidly. Further, the Charge Rate/Progress indicators 120 may turn off. The battery charger 100 may automatically begin "trickle charging" the battery for up to a pre-set amount of time while waiting for the user to disconnect the battery. Once the battery is disconnected, at Step 1607, the battery charger 100 may, in Step 1608, illuminate the Charge Rate/Progress indicators in the "runway" pattern, indicating that the battery charger 100 is awaiting coupling of a battery to the charge output port 114.

Figure 17:
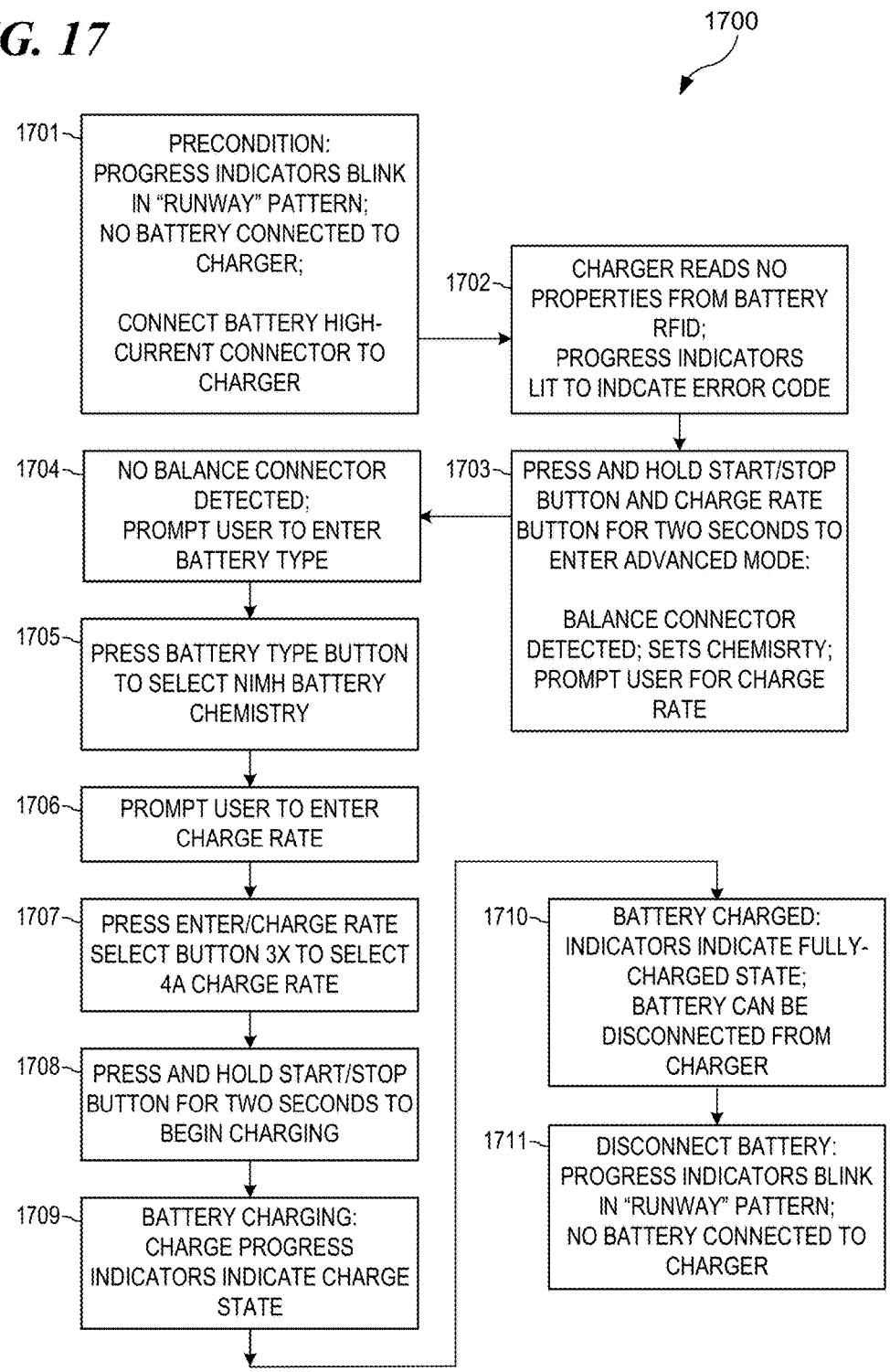
FIG. 17 is a flowchart illustrating a mode of operation of a battery charger.

The battery charger 100 may be used in accordance with method 1000 to fully charge a NiMH battery without an RFID chip, as shown in FIG. 17. At Step 1701, the battery charger may be electrically coupled to a power supply and the NiMH battery may be connected to the charge output port.

At Step 1702, the battery charger may detect that the battery is not implemented with an RFID tag and respond by illuminating the Charging Rate/Status indicators in a sweeping manner. The battery charger may remain in this state and await action by the user. At Step 1703, the user may elect to enter "Advanced Mode" by simultaneously pressing and holding the "Start/Stop" and the "Charge Rate" push buttons for 2 seconds.

At Step 1704, the battery charger may detect that no balance connector is electrically coupled to a balance port and prompt the user to select a Battery Type by illuminating the "LiPo" and "NiMH" battery type selection indicators in an alternating manner. The user may select the "NiMH" Battery Type by pressing the "Battery Type" push button twice at Step 1705. The battery charger may illuminate the "NiMH" Battery Type selection indicator in a solid mode.

At Step 1706, the "1 A" Charge Rate/Progress indicator may begin flashing to indicate to the user that the battery charger is awaiting a Charge Rate selection by the user. At Step 1707, the user may change the Charge Rate to a desired setting of "4 A" by pressing the "Charge Rate" push button three times. Upon user selection of a Charge Rate, the battery charger 100 may become ready to begin supplying a charge current to the battery to be charged. The user may begin charging operation at Step 1708 by pressing and holding the "Start/Stop" button for 2 seconds.

At Step 1709, battery charging commences and the Charge Status indicator 118 "blinks." The Charge Rate/Progress indicators 120 also illuminate to display the amount of charge contained by the battery relative to the peak charge of the battery. At Step 1710, the charging process completes, the Charge Status indicator 118 may be configured to cease blinking and illuminate solidly. Further, the Charge Rate/Progress indicators 120 may turn off. The battery charger 100 may automatically begin "trickle charging" the battery for up to a pre-set amount of time while waiting for the user to disconnect the battery.

Once the battery is disconnected, at Step 1711, the battery charger 100 may illuminate the Charge Rate/Progress indicators in the "runway" pattern, indicating that the battery charger 100 is awaiting coupling of a battery to the charge output port 114.

It should be appreciated that an embodiment of the battery charger 200, as described above, may be implemented with a method of operation similar to that shown in FIG. 10 and described in reference to the battery charger 100, with the steps associated to LiPo battery charging omitted, to perform the charging operations described in FIGS. 16 and 17 above.

Having thus described the present invention by reference to certain of its exemplary embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Additional details are presented the Appendix attached hereto and incorporated by reference for all purposes. Many such variations and modifications may be considered desirable, based upon a review of the foregoing description of exemplary embodiments. Accordingly, it is appropriate that any claims supported by this description be construed broadly and in a manner consistent with the scope of the invention.

The invention claimed is:

1. A battery charger, comprising:
    an electrical connector for electrically coupling to a battery to be charged and delivering a configurable electrical charge for charging the battery to be charged;
    a sensor for obtaining information receivable from an RFID device connected to the battery to be charged, the information receivable comprising a battery type or a battery cell count;
    a memory for storing a plurality of predefined charging parameter settings of the battery charger, the predefined charging parameter settings configured to correspond to the information receivable from the RFID device;
    balance terminals and a balance connector port;
    wherein the charger at least partially configures the electrical charge delivered to the battery to be charged in accordance with the predefined charging parameter settings corresponding to the information receivable; and wherein the balance terminals and the balance port are configured to balance charge the battery to be charged when the battery to be charged is a Lithium Polymer battery.

2. The battery charger of claim 1, wherein the sensor receives information from the RFID device comprising a chip integrated with a housing associated with the battery to be charged, before the battery is electrically coupled to the electrical connector.

3. The battery charger of claim 1, wherein the electrical connector comprises an electrical socket for receiving an electrical plug coupled to the battery to be charged.

4. The battery charger of claim 1, further comprising a battery information receipt indicator that comprises a light emitting device configured to illuminate upon receipt of the information receivable.

5. The battery charger of claim 1, further comprising a switch for initiating delivery of the electrical charge when the switch is actuated following configuration of the electrical charge.

6. The battery charger of claim 5, wherein actuating the switch while the battery charger is delivering the electrical charge to the battery terminates delivery of the electrical charge.

7. The battery charger of claim 1, further comprising a charge progress indicator, wherein the charge progress indicator comprises a plurality of light emitting devices configured to illuminate in succession for indicating an amount of the electrical charge delivered to the battery to be charged.

8. The battery charger of claim 1, further comprising a charge status indicator, wherein the charge status indicator comprises a light emitting device configured to illuminate in a first mode during charging and in a second mode when charging is completed.

9. The battery charger of claim 7, wherein once the electrical connector is coupled to the battery to be charged, the charge progress indicator illuminates in a first mode when the sensor receives the information receivable, and in a second mode when the sensor does not receive the information receivable.

10. The battery charger of claim 1, wherein the predefined charging parameter settings comprise a charge rate setting.

11. The battery charger of claim 1, wherein the electrical charge delivered is configured by manually adjusting one or more charging parameter settings.

12. The battery charger of claim 11, further comprising:
a charge rate selection switch;
wherein the charging parameter settings comprise a charge rate setting; and
wherein actuating the charge rate selection switch varies the charge rate setting in relation to a number of times the charge rate selection switch is actuated.

13. The battery charger of claim 1, wherein the plurality of predefined charging parameter settings stored in the memory may not be manually altered.

14. The battery charger of claim 1, further comprising a charge rate indicator comprising a plurality of light emitting devices configured to illuminate in succession for indicating an amperage of the electrical charge to be delivered to the battery to be charged prior to charging.

15. A battery charger, comprising:
an electrical connector for electrically coupling to a battery to be charged and delivering a configurable electrical charge for charging the battery to be charged;

a sensor for obtaining information receivable from an RFID device connected to the battery to be charged, the information receivable comprising a battery type or a battery cell count;

a memory for storing a plurality of predefined charging parameter settings of the battery charger, the predefined charging parameter settings configured to correspond to the information receivable from the RFID device;

balance terminals and a balance connector port;

wherein the charger at least partially configures the electrical charge delivered to the battery to be charged in accordance with the predefined charging parameter settings corresponding to the information receivable;

wherein charging parameter settings of the predefined charging parameter settings comprise a charge rate setting, a charge mode setting, and a battery type setting; and wherein the balance terminals and the balance port are configured to balance charge the battery to be charged when the battery to be charged is a Lithium Polymer battery.

16. The battery charger of claim 15,
wherein the battery charger is configured to automatically select the battery type setting corresponding to lithium-polymer batteries when the battery to be charged is a lithium polymer battery and a balance connector of the lithium-polymer battery is coupled to the balance connector port.

17. The battery charger of claim 15, wherein the charge mode setting further comprise a storage charge setting, a fast charge setting, and a balance charge setting.

18. The battery charger of claim 15, further comprising:
a first switch that initiates delivery of the electrical charge to the battery to be charged when actuated.

19. The battery charger of claim 18, further comprising:
a second switch that varies the charge rate setting in relation to the number of times the second switch is actuated;
a third switch that toggles the battery type setting between at least two battery type settings; and
a fourth switch that toggles the charge mode setting between at least three charge mode settings when the battery to be charged is a lithium-polymer battery.

20. A method of configuring a charge delivered by a battery charger, comprising:
coupling the battery charger to a battery to be charged;
receiving information from an RFID chip connected to the battery to be charged;
storing a plurality of predefined charging parameter settings within a memory of the battery charger, the predefined charging parameter settings configured to correspond to the information received from the battery to be charged;
selecting one or more charging parameters in accordance with predefined charging parameter settings corresponding to the information received, wherein the information received comprises either or both of a battery type and a battery cell count; and
wherein the predefined charging parameter setting corresponding to lithium-polymer batteries is automatically selected when a balance connector is coupled to a connector port.

21. The method according to claim 20, wherein the method further includes:
   actuating a first switch to initiate delivery of the charge to the battery to be charged.

* * * * *